(12) United States Patent
Cheng et al.

(10) Patent No.: US 9,997,520 B2
(45) Date of Patent: Jun. 12, 2018

(54) SEMICONDUCTOR DEVICE STRUCTURE WITH CAPACITOR AND METHOD FOR FORMING THE SAME

(71) Applicant: TAIWAN SEMICONDUCTOR MANUFACTURING CO., LTD., Hsin-Chu (TW)

(72) Inventors: Tai-Shin Cheng, Hsinchu (TW); Che-Cheng Chang, New Taipei (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days. days.

(21) Appl. No.: 14/815,419

(22) Filed: Jul. 31, 2015

(65) Prior Publication Data

US 2017/0033112 A1    Feb. 2, 2017

(51) Int. Cl.
  *H01L 29/00*    (2006.01)
  *H01L 27/108*   (2006.01)
  *H01L 49/02*    (2006.01)
  *H01L 23/48*    (2006.01)
  *H01L 23/522*   (2006.01)

(52) U.S. Cl.
  CPC ...... *H01L 27/10808* (2013.01); *H01L 23/481* (2013.01); *H01L 23/5223* (2013.01); *H01L 27/10855* (2013.01); *H01L 28/86* (2013.01); *H01L 28/87* (2013.01); *H01L 28/91* (2013.01)

(58) Field of Classification Search
  CPC ......... H01L 27/10808; H01L 27/10855; H01L 21/76802; H01L 21/76877; H01L 28/86; H01L 28/82; H01L 28/90; H01L 27/10835; H01L 27/10852; H01L 28/91

USPC ................. 257/534, 300, 303, 306
See application file for complete search history.

(56) References Cited

U.S. PATENT DOCUMENTS

| 6,037,262 A | 3/2000 | Hsia et al. |
| 6,737,699 B2 * | 5/2004 | Block ............ H01L 28/87 |
| | | 257/306 |
| 7,977,726 B2 | 7/2011 | Sim |
| 2008/0217775 A1 | 9/2008 | Pai et al. |

(Continued)

FOREIGN PATENT DOCUMENTS

| CN | 1431698 A | 7/2003 |
| TW | 381340 B  | 2/2000 |

*Primary Examiner* — Kimberly Rizkallah
*Assistant Examiner* — Dilinh Nguyen
(74) *Attorney, Agent, or Firm* — Birch, Stewart, Kolasch & Birch, LLP

(57) ABSTRACT

A semiconductor device structure is provided. The semiconductor device structure includes a substrate. The semiconductor device structure includes a conductive structure in or over the substrate. The semiconductor device structure includes a first dielectric layer over the substrate. The first dielectric layer has a first opening exposing the conductive structure. The semiconductor device structure includes a second dielectric layer over the first dielectric layer. The second dielectric layer has a second opening connected to the first opening and exposing the conductive structure. The semiconductor device structure includes a capacitor covering a first inner wall of the first opening, a second inner wall of the second opening, and a top surface of the conductive structure. The capacitor is electrically connected to the conductive structure.

17 Claims, 24 Drawing Sheets

(56) References Cited

U.S. PATENT DOCUMENTS

2009/0090998 A1* 4/2009 Woo ..................... H01L 21/768
　　　　　　　　　　　　　　　　　　　　　　257/532

* cited by examiner

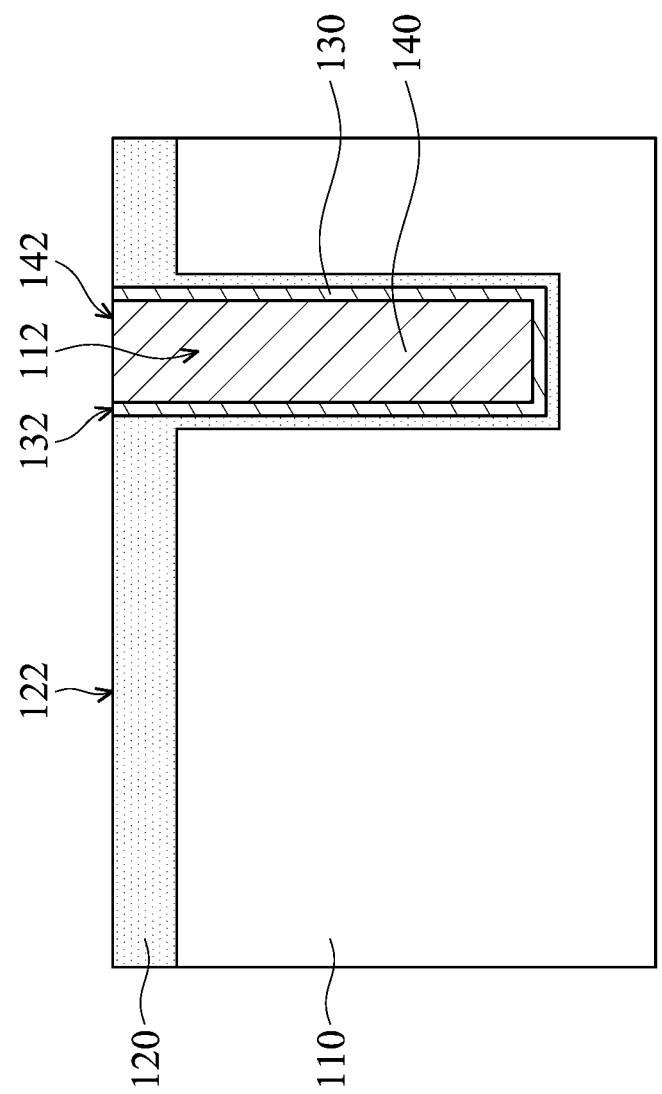

SEMICONDUCTOR DEVICE STRUCTURE WITH CAPACITOR AND METHOD FOR FORMING THE SAME

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1A:
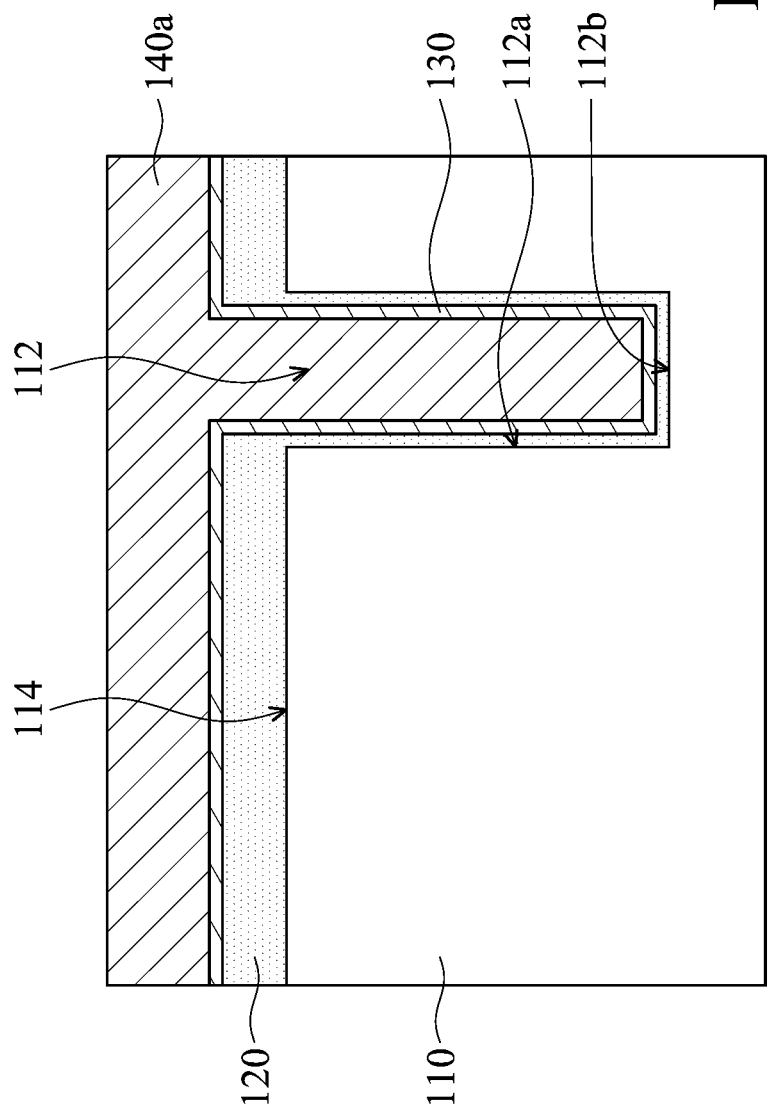
FIGS. 1A-1T are cross-sectional views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Figure 1C:
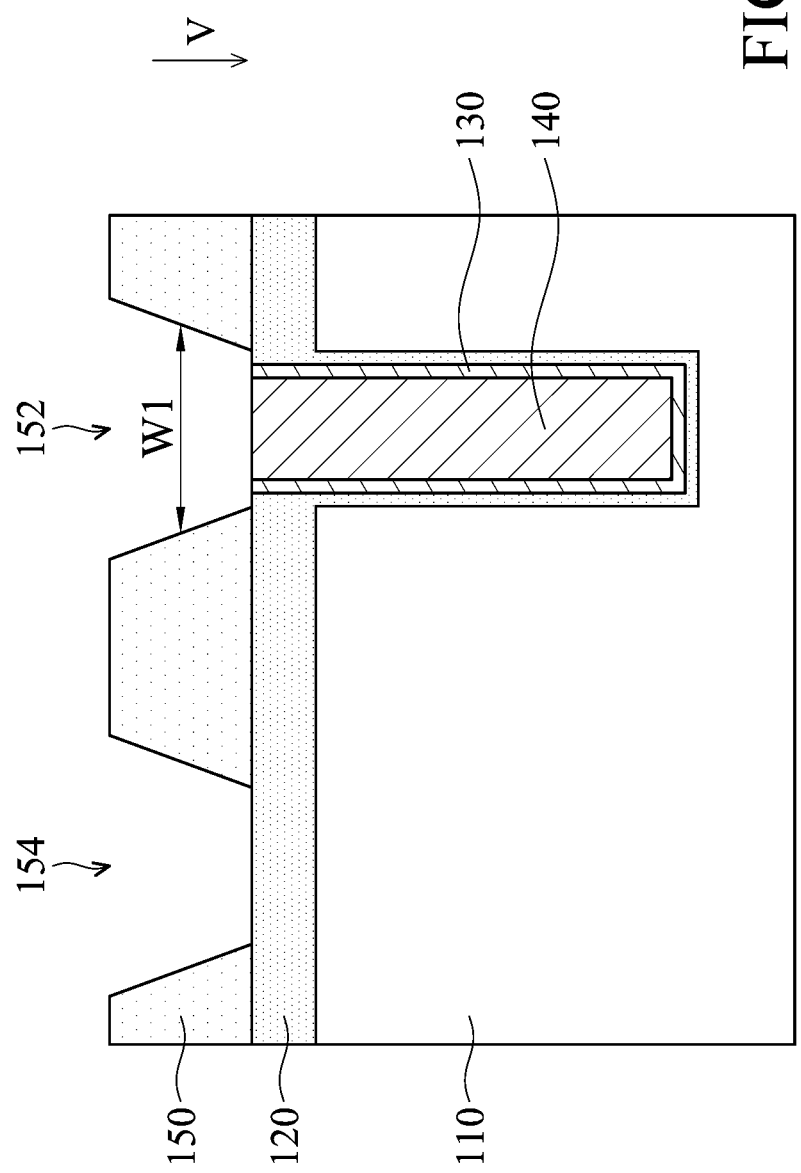
Figure 1D:
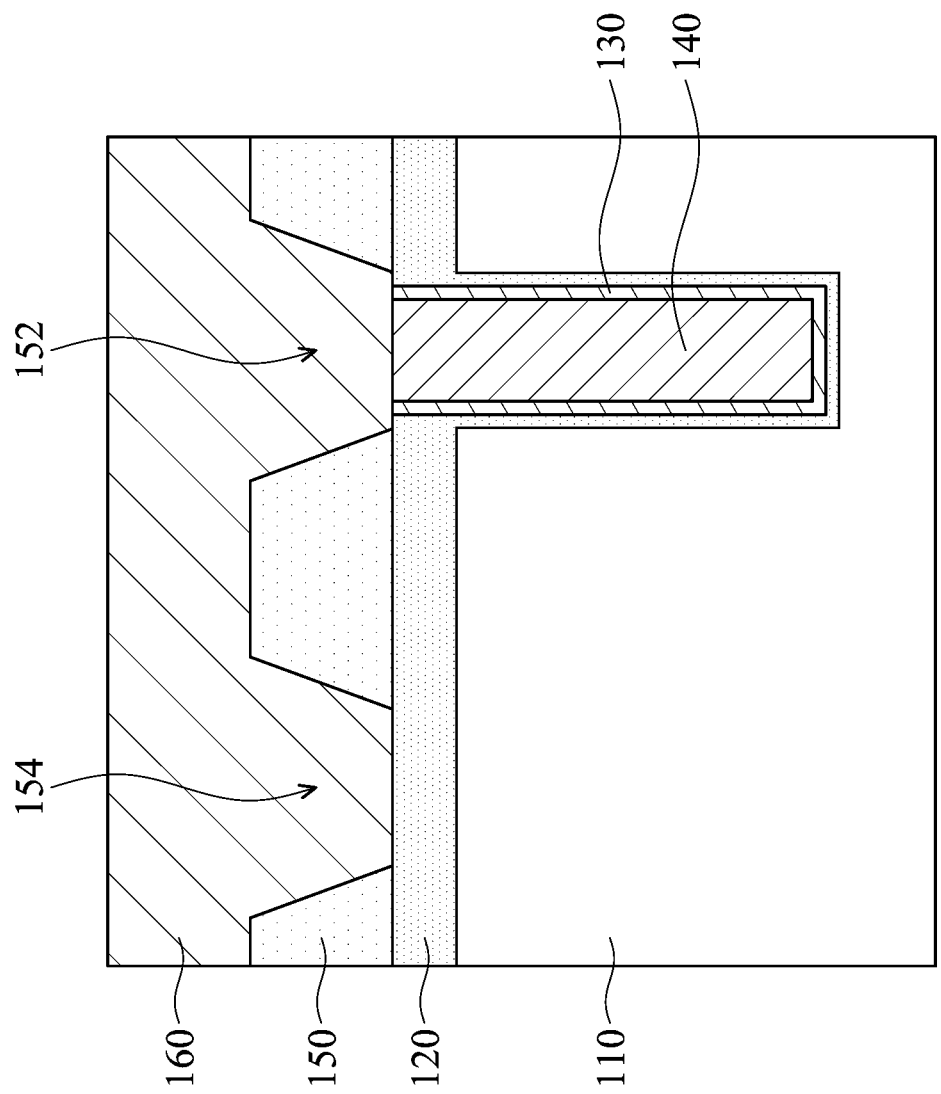
Figure 1E:
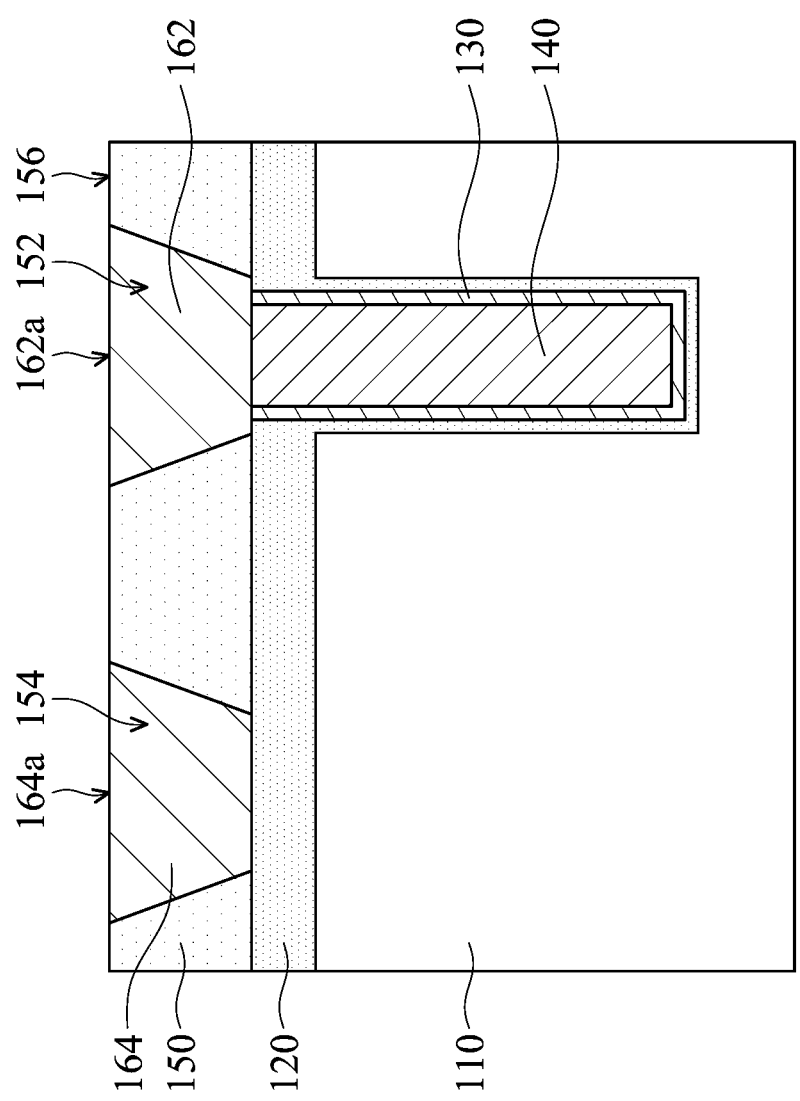
Figure 1F:
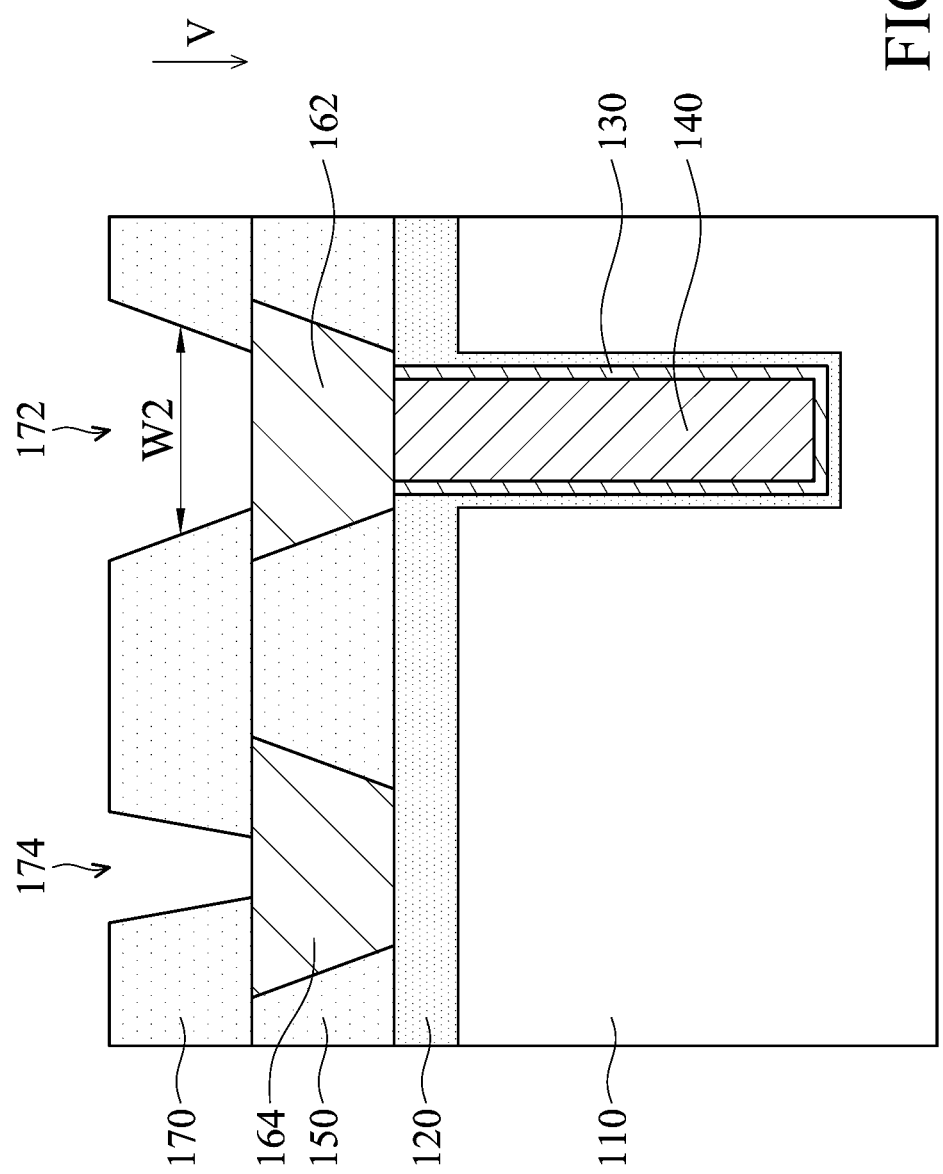
Figure 1G:
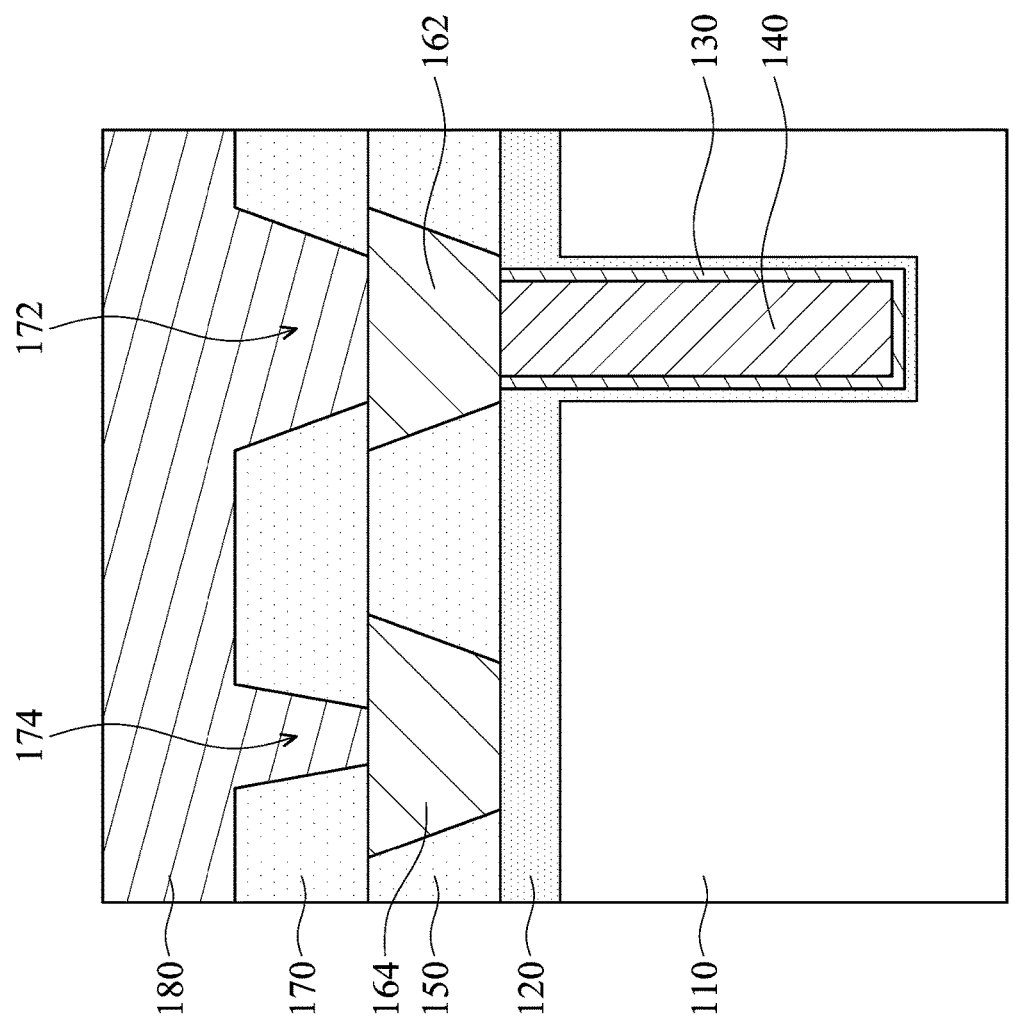
Figure 1H:
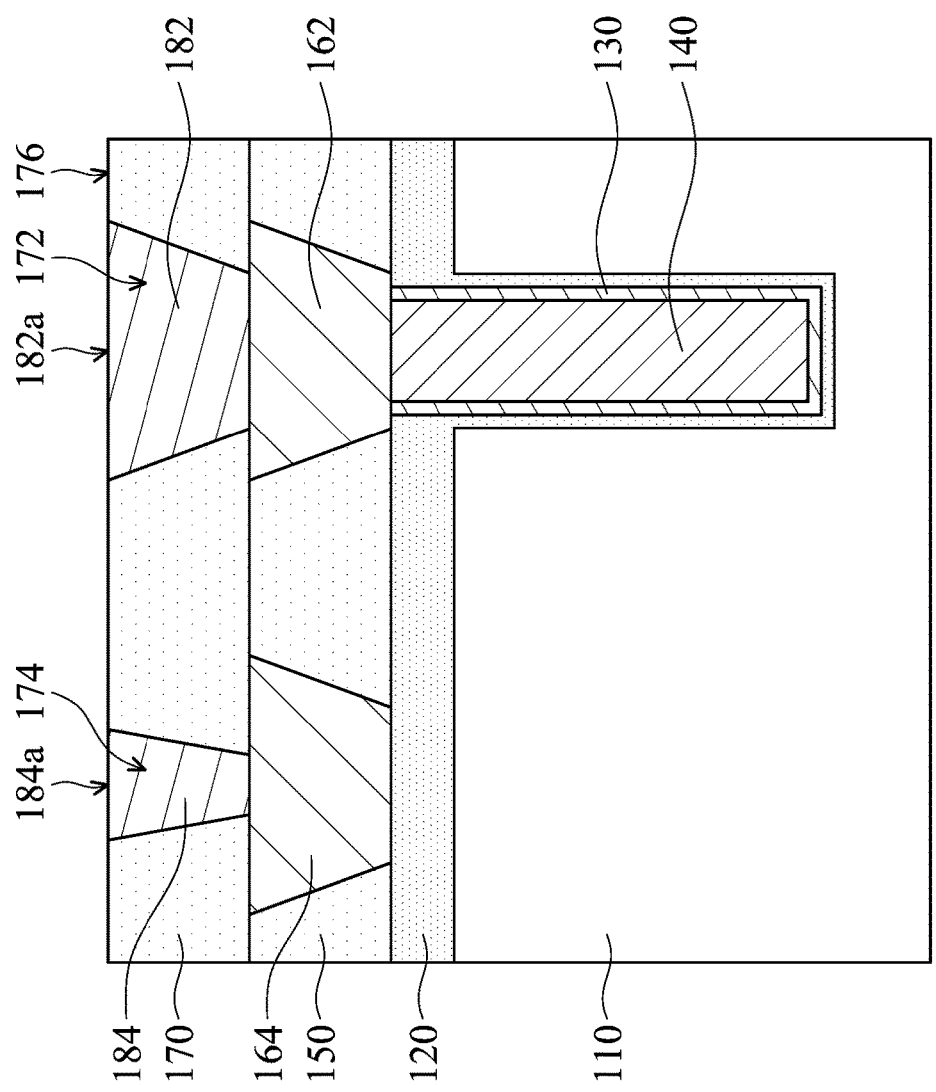
Figure 1I:
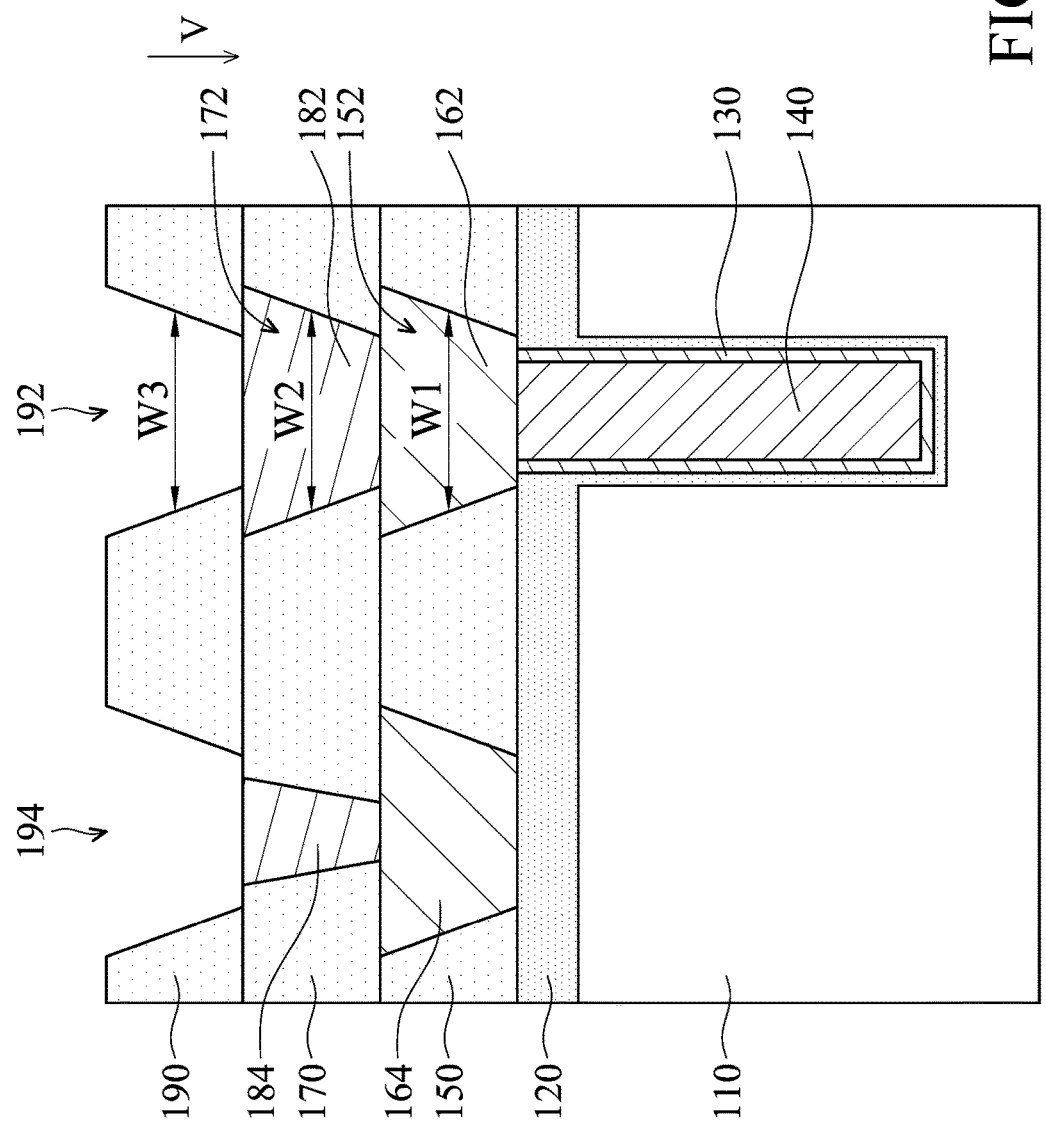
Figure 1J:
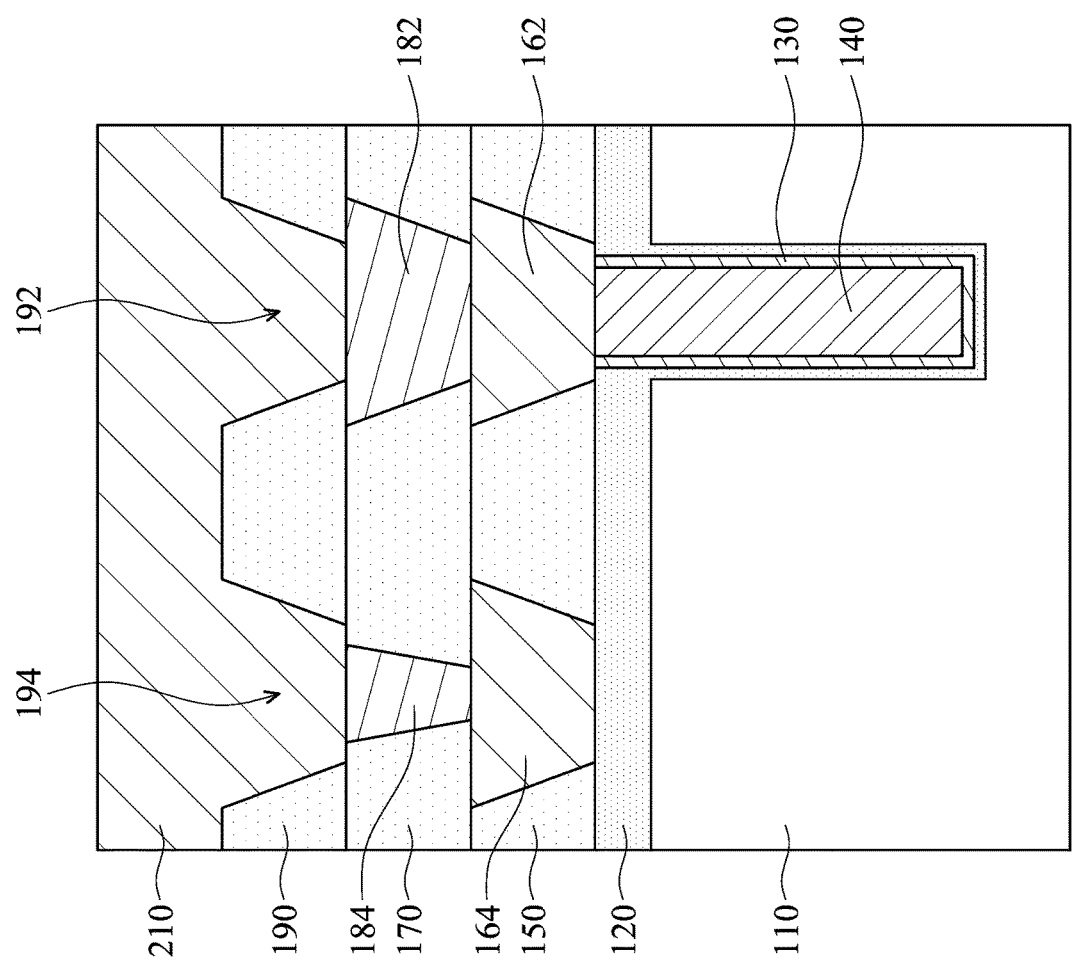
Figure 1K:
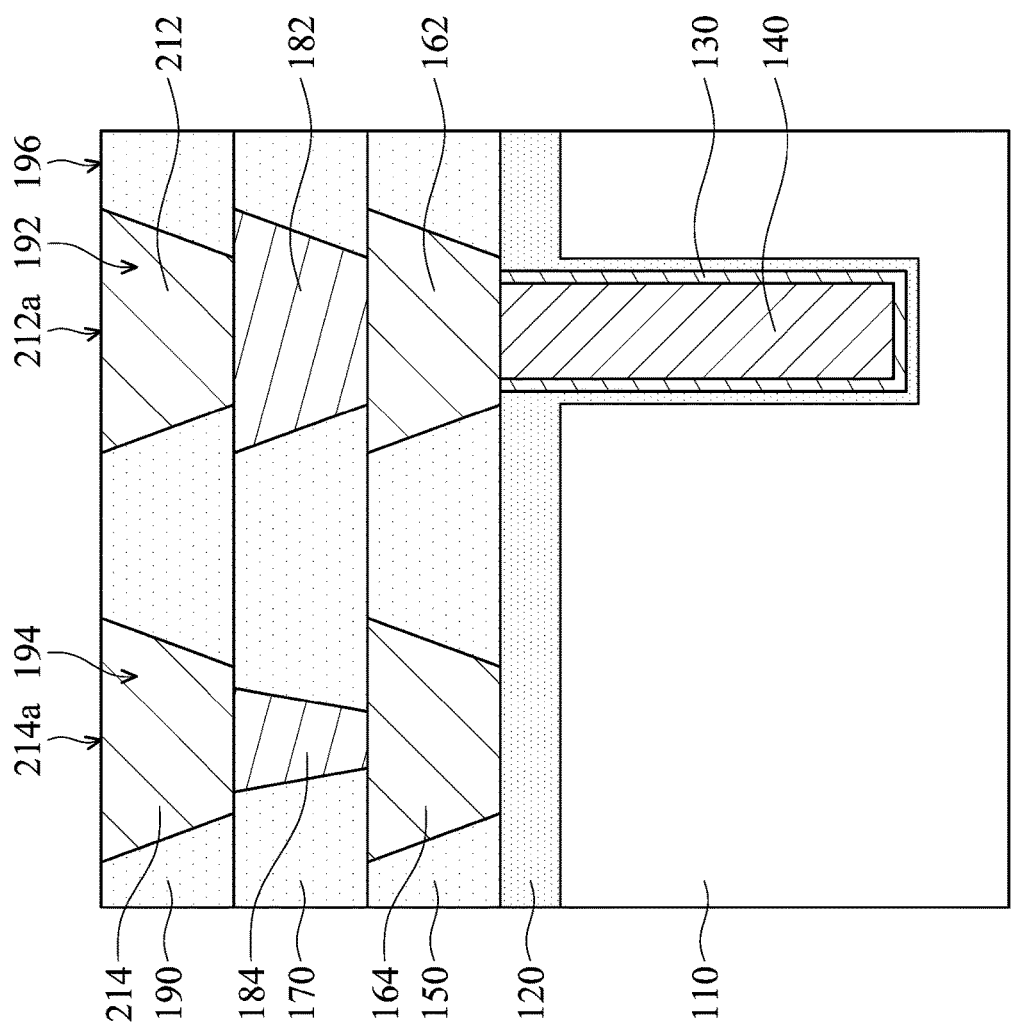
Figure 1L:
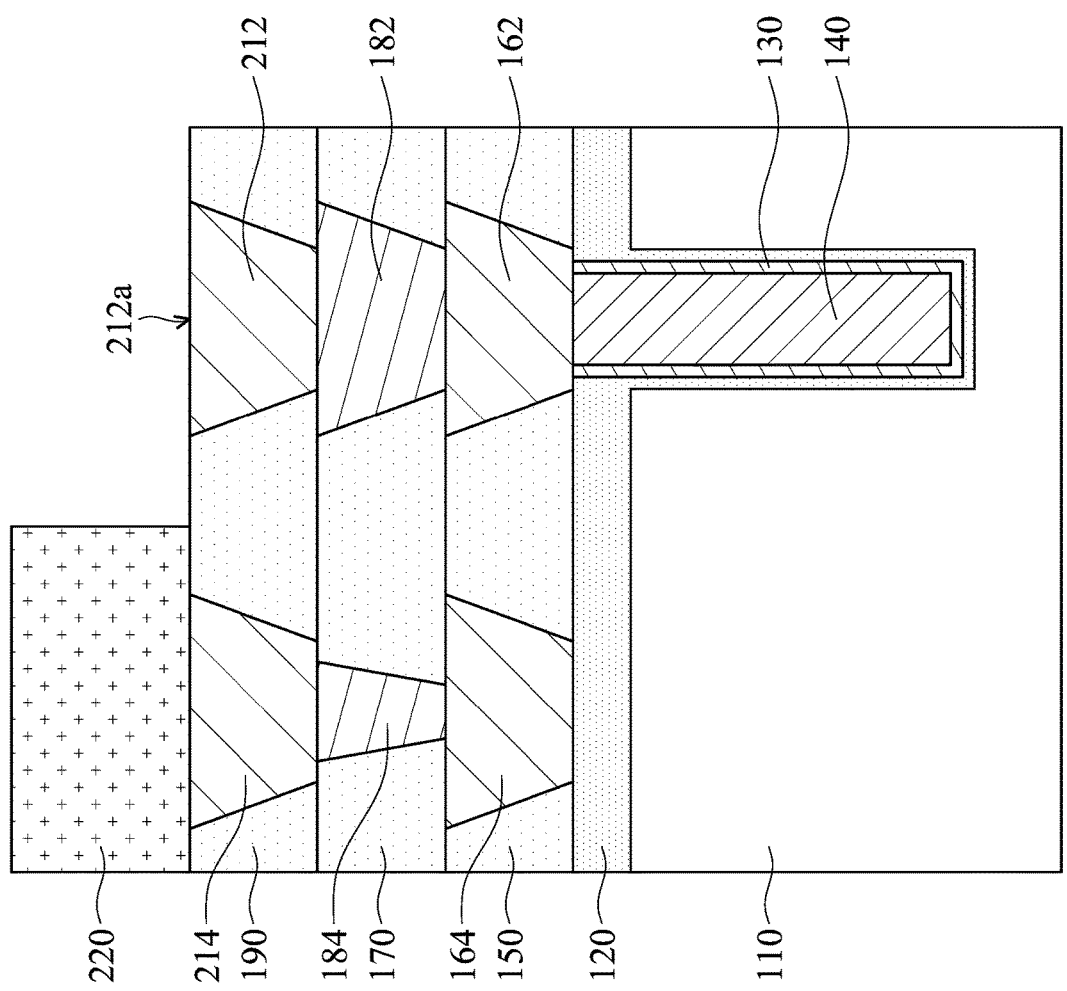
Figure 1M:
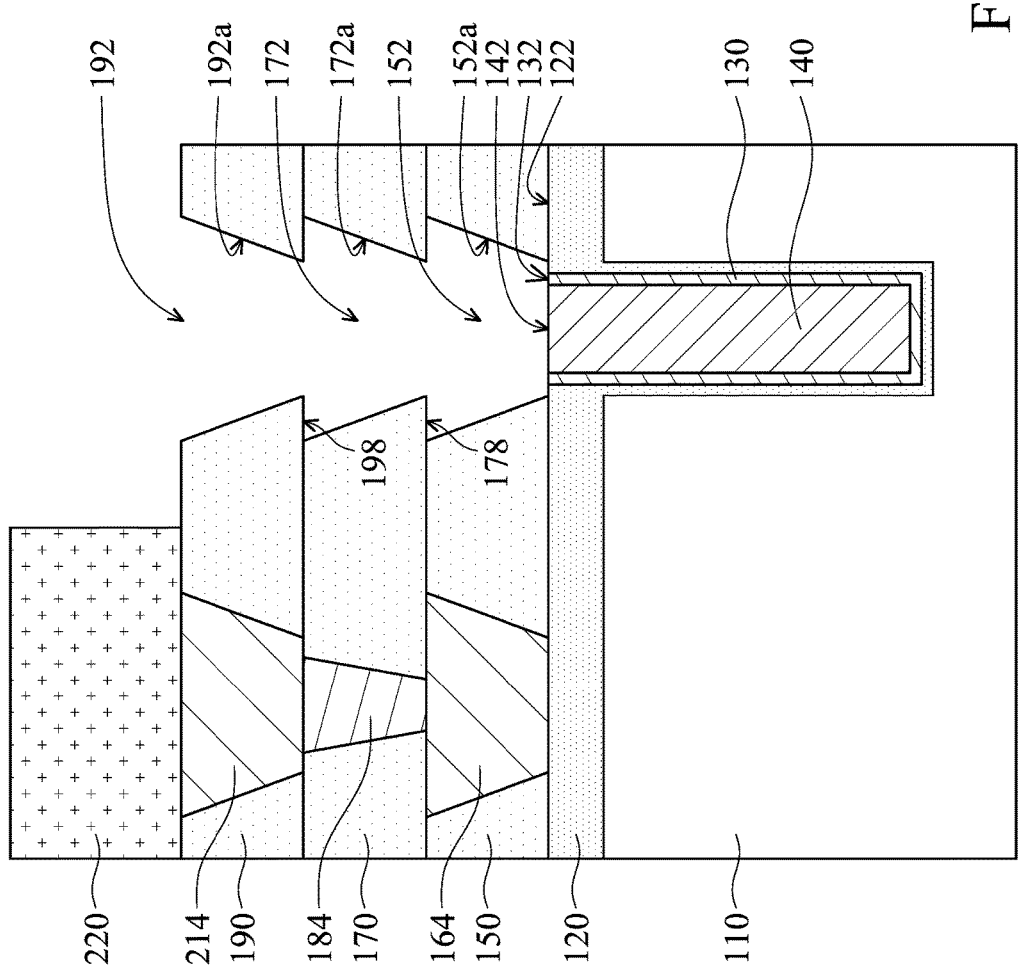
Figure 1N:
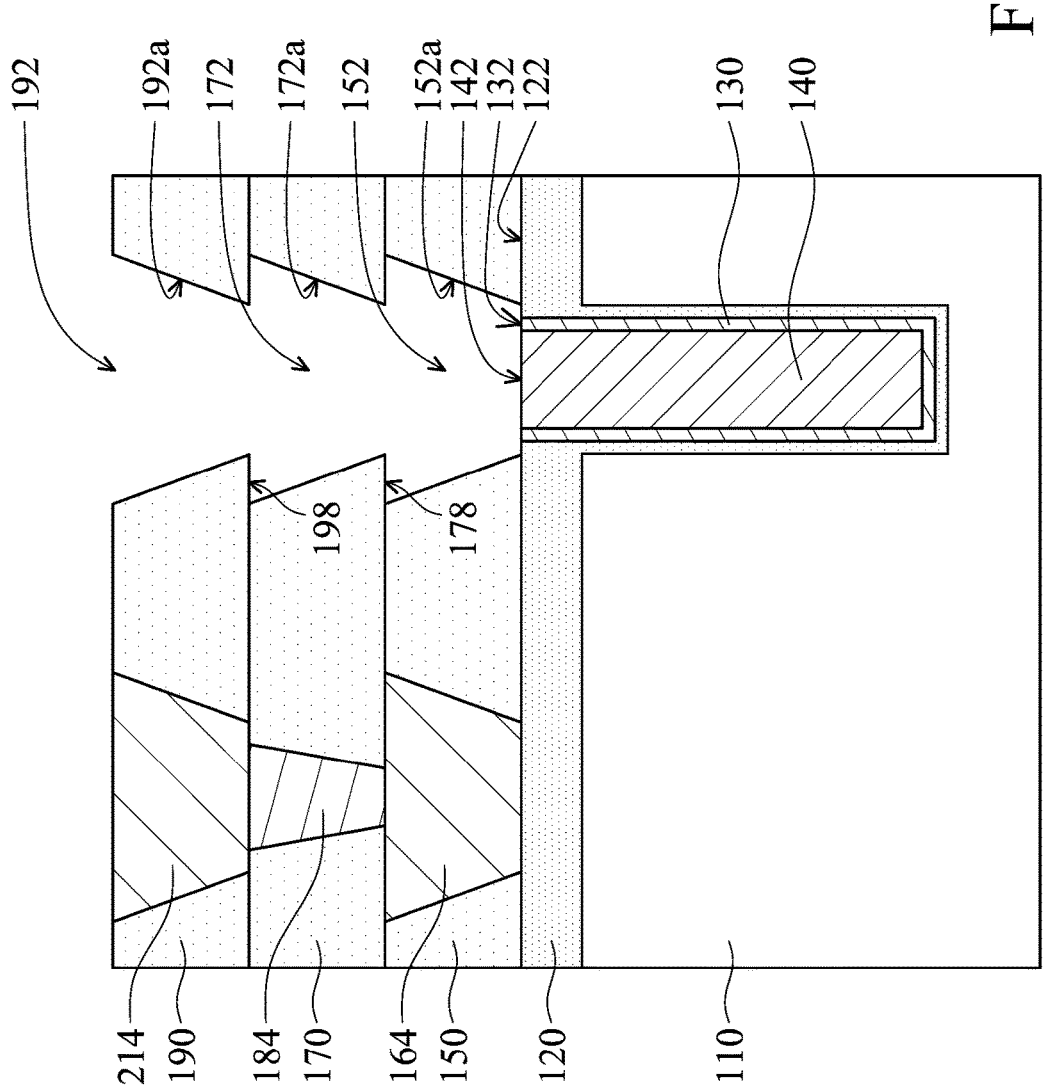
Figure 1O:
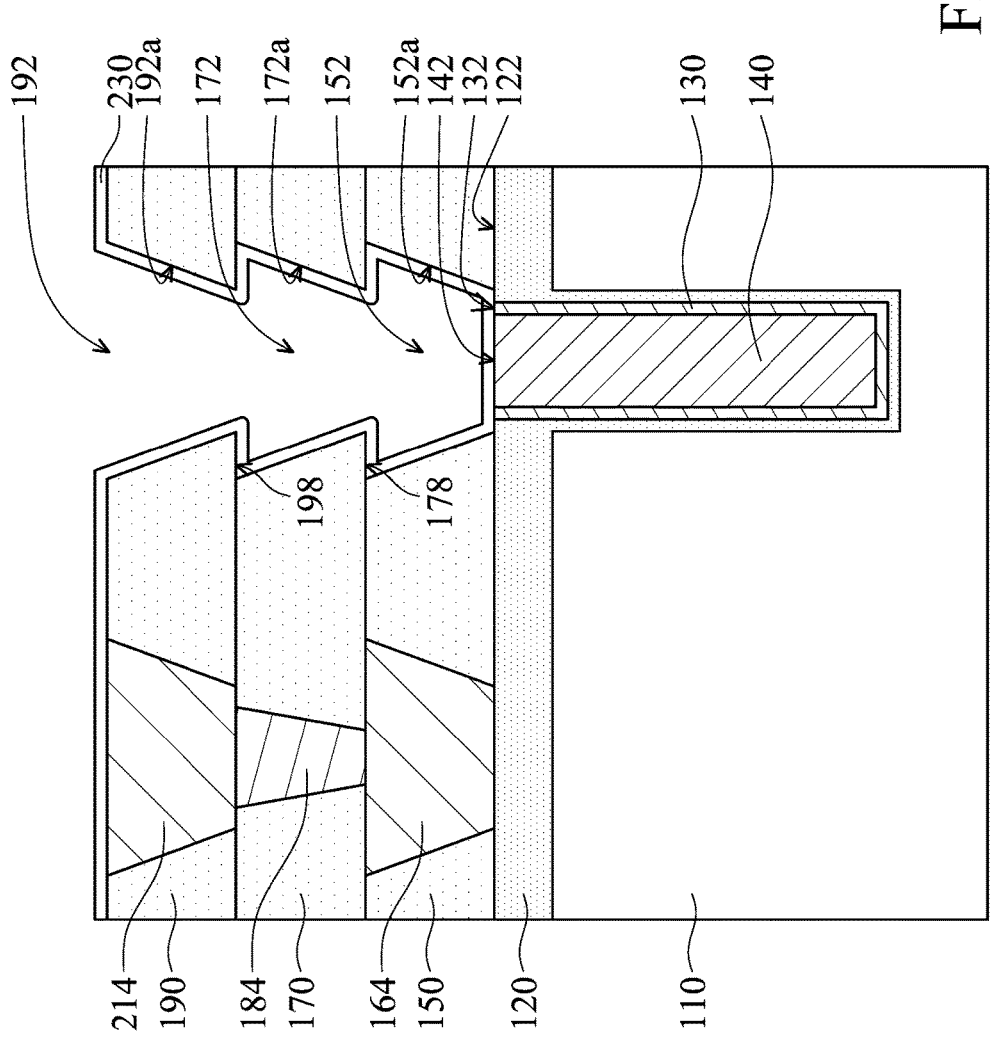
Figure 1P:
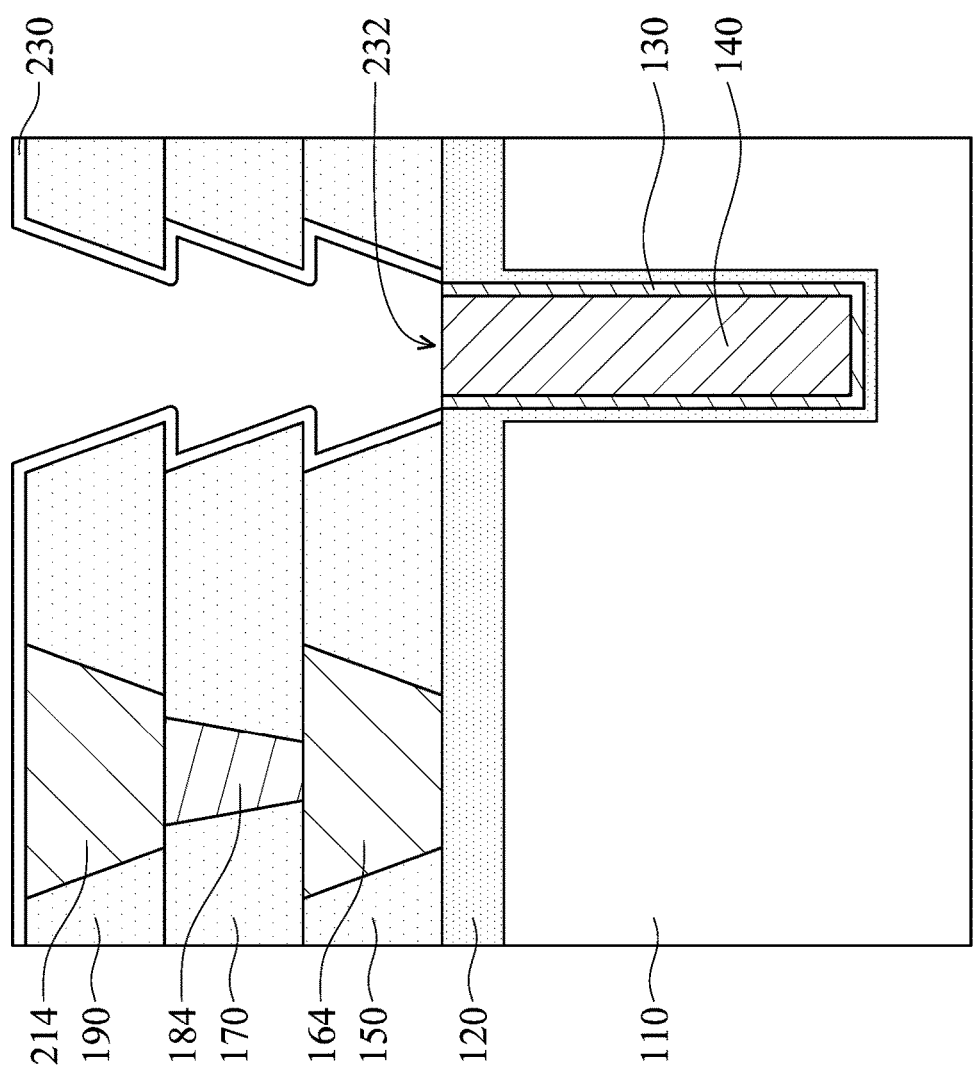
Figure 1Q:
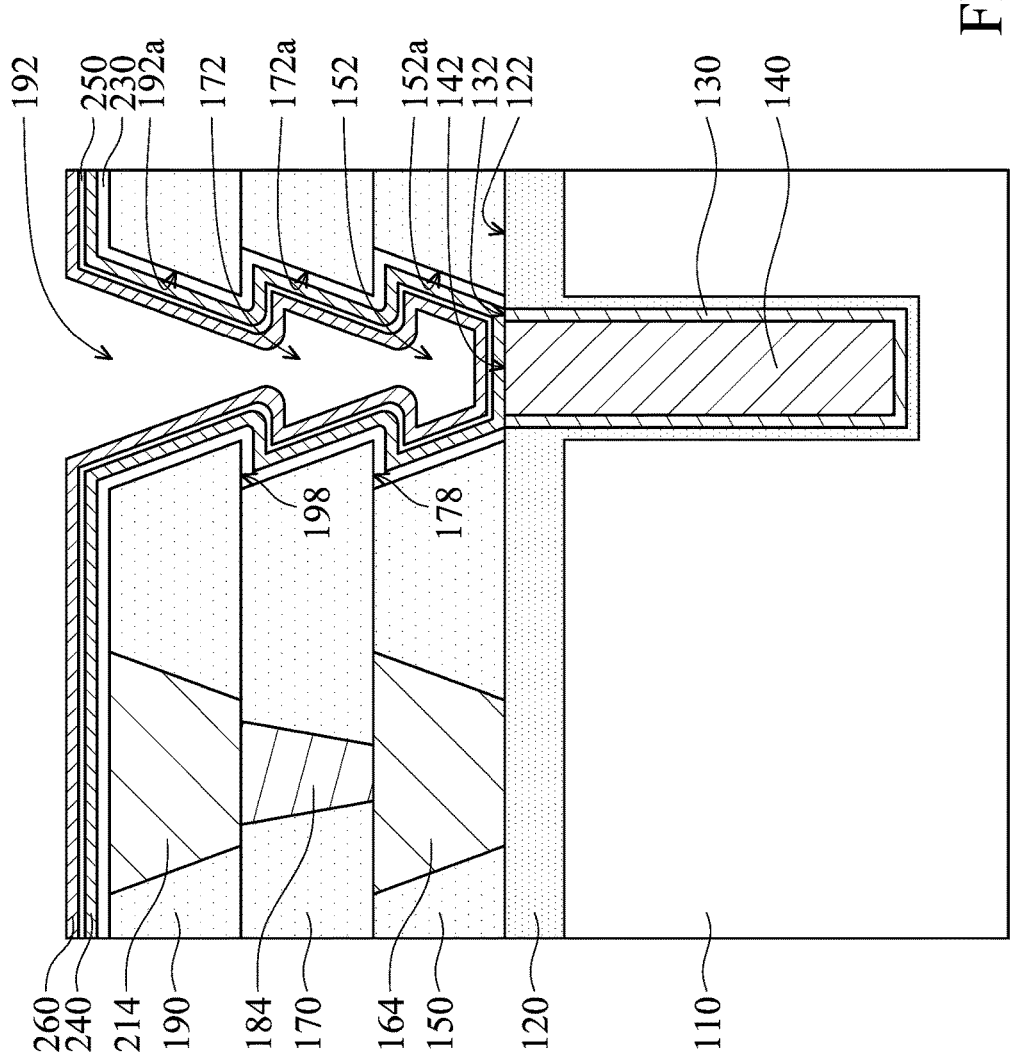
Figure 1R:
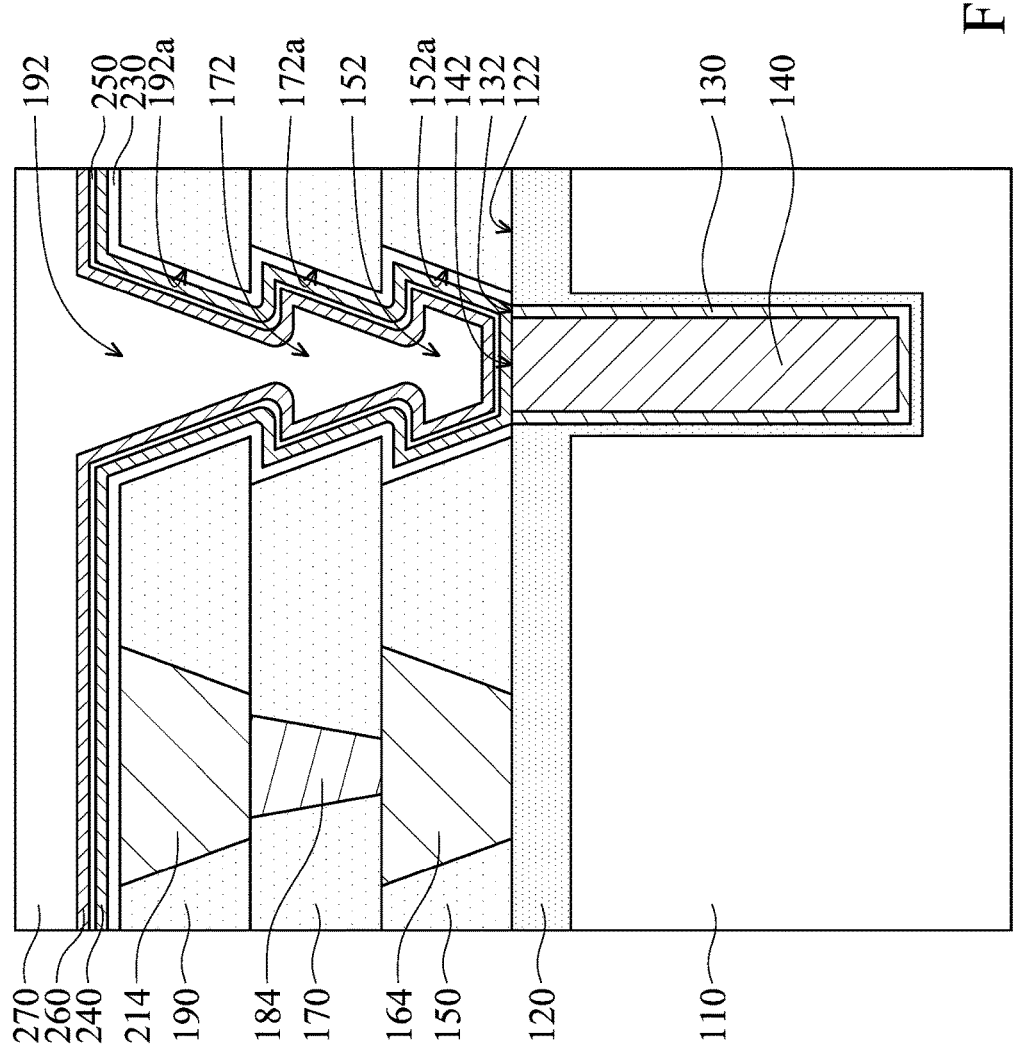
Figure 1S:
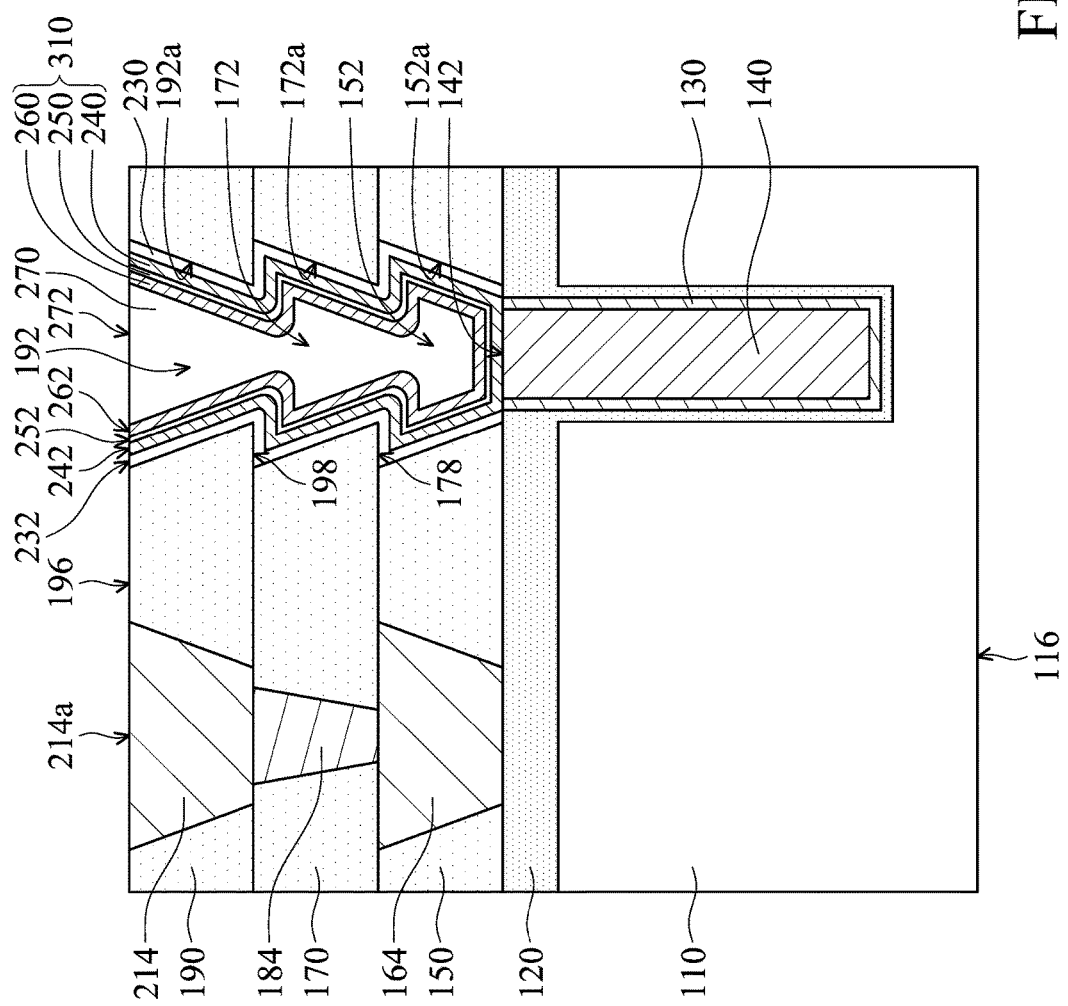
Figure 1T:
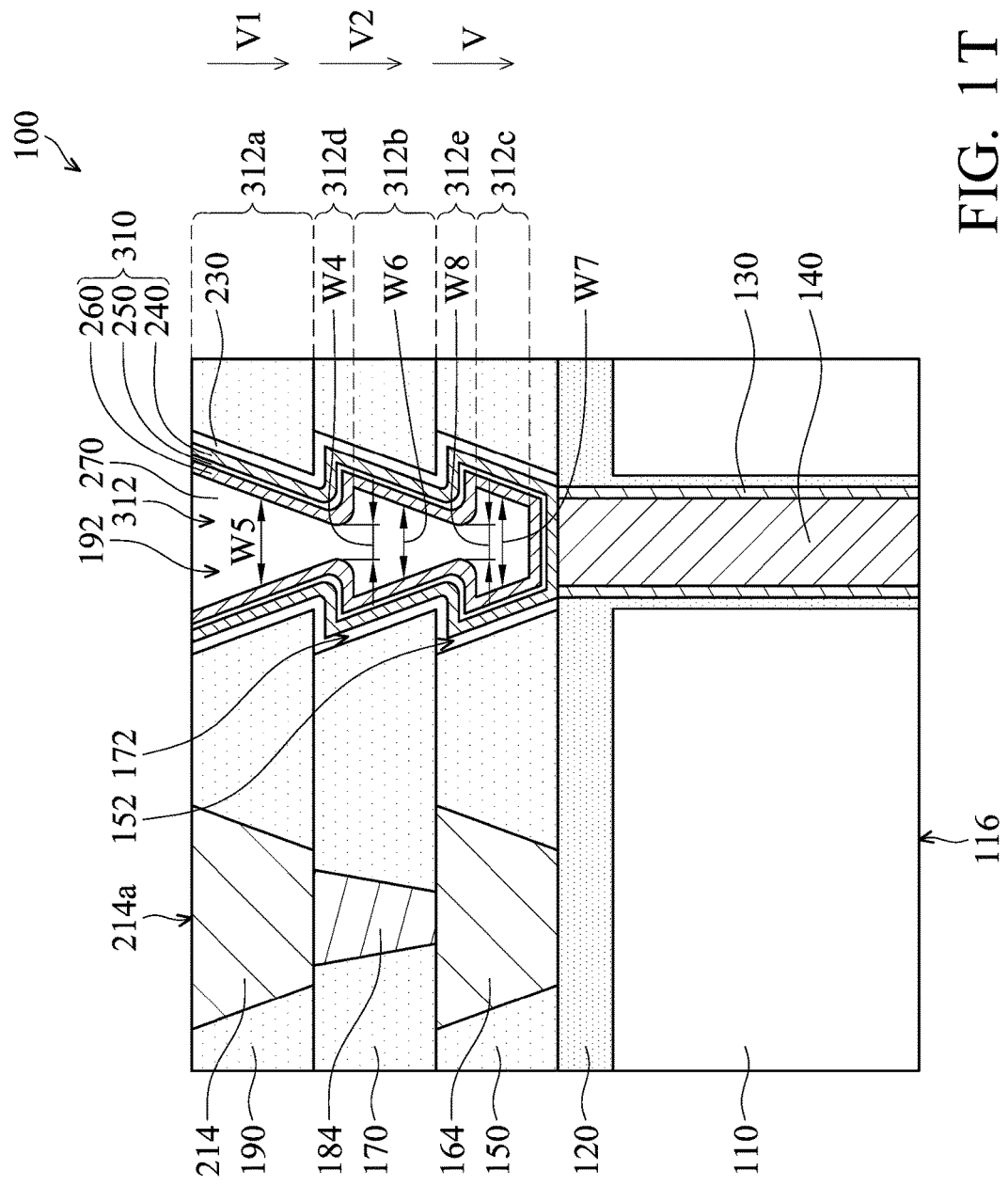

FIGS. 1A-1T are cross-sectional views of various stages of a process for forming a semiconductor device structure, in accordance with some embodiments. Referring to FIG. 1A, a substrate 110 is provided. The substrate 110 may be a semiconductor wafer (such as a silicon wafer) or a portion of a semiconductor wafer.

In some embodiments, the substrate 110 is made of an elementary semiconductor material including silicon or germanium in a single crystal, polycrystal, or amorphous structure. In some other embodiments, the substrate 110 is made of a compound semiconductor, such as silicon carbide, gallium arsenide, gallium phosphide, indium phosphide, indium arsenide, an alloy semiconductor, such as SiGe, or GaAsP, or combinations thereof. The substrate 110 may also include multi-layer semiconductors, semiconductor on insulator (SOI) (such as silicon on insulator or germanium on insulator), or combinations thereof.

As shown in FIG. 1A, a via hole 112 is formed in the substrate 110, in accordance with some embodiments. The formation of the via hole 112 includes performing a photolithography process and an etching process, in accordance with some embodiments. As shown in FIG. 1A, a liner layer 120 is formed over the substrate 110 and the via hole 112, in accordance with some embodiments. The liner layer 120 covers a top surface 114 of the substrate 110 and an inner wall 112a and a bottom surface 112b of the via hole 112, in accordance with some embodiments.

The liner layer 120 conformally covers the top surface 114, the inner wall 112a, and the bottom surface 112b, in accordance with some embodiments. The liner layer 120 includes a dielectric layer, in accordance with some embodiments. The liner layer 120 includes oxide, such as silicon oxide, in accordance with some embodiments. The liner layer 120 is formed using a thermal oxidation process, in accordance with some embodiments.

As shown in FIG. 1A, a barrier layer 130 is formed over the liner layer 120, in accordance with some embodiments. The barrier layer 130 is configured to prevent diffusion of metal materials formed in the via hole 112 into the liner layer 120 and the substrate 110, in accordance with some embodiments. The barrier layer 130 includes tantalum (Ta) and tantalum nitride (TaN), in accordance with some embodiments. The barrier layer 130 is formed using a physical vapor deposition (PVD) process, a chemical vapor deposition (CVD) process, or another suitable process.

As shown in FIG. 1A, a conductive layer 140a is formed over the barrier layer 130 and filled into the via hole 112, in accordance with some embodiments. The conductive layer 140a includes copper (Cu), tungsten (W), aluminum (Al), or another suitable material. The conductive layer 140a is formed using a physical vapor deposition process, a plating process, or another suitable process.

As shown in FIG. 1B, the barrier layer 130 and the conductive layer 140a outside of the via hole 112 are removed, in accordance with some embodiments. The removal process includes a chemical mechanical polishing process, in accordance with some embodiments. The conductive layer 140a remaining in the via hole 112 forms a conductive structure 140, in accordance with some embodiments. In some embodiments, a top surface 142 of the conductive structure 140, a top surface 132 of the barrier layer 130, and a top surface 122 of the liner layer 120 are aligned with each other.

As shown in FIG. 1C, a dielectric layer 150 is formed over the liner layer 120, in accordance with some embodiments. The dielectric layer 150 has an opening 152 and a recess 154, in accordance with some embodiments. The opening 152 exposes the conductive structure 140, the barrier layer 130, and a portion of the liner layer 120, in accordance with some embodiments.

The opening 152 includes a trench, a hole, or an opening with a suitable shape depending on requirements or the layout design of conductive features formed over the substrate 110, in accordance with some embodiments. In some embodiments, a width W1 of the opening 152 decreases in a direction V toward the substrate 110. The width W1 of the opening 152 continuously decreases in the direction V, in accordance with some embodiments.

The recess 154 exposes another portion of the liner layer 120, in accordance with some embodiments. The recess 154 includes a trench, a hole, or an opening with a suitable shape depending on requirements or the layout design of conductive features formed over the substrate 110, in accordance with some embodiments.

The dielectric layer 150 includes, but is not limited to, oxide, $SiO_2$, borophosphosilicate glass (BPSG), spin on glass (SOG), undoped silicate glass (USG), fluorinated silicate glass (FSG), high-density plasma (HDP) oxide, or plasma-enhanced TEOS (PETEOS).

The dielectric layer 150 may include multilayers made of multiple dielectric materials, such as a low dielectric constant or an extreme low dielectric constant (ELK) material. The dielectric layer 150 may be formed by chemical vapor deposition (CVD), physical vapor deposition (PVD), atomic layer deposition (ALD), spin-on coating, or another applicable process. The dielectric layer 150 is patterned using a photolithography process and an etching process, in accordance with some embodiments.

As shown in FIG. 1D, a conductive layer 160 is formed over the dielectric layer 150 and filled into the opening 152 and the recess 154, in accordance with some embodiments. The conductive layer 160 includes copper (Cu), tungsten (W), aluminum (Al), or another suitable material. The conductive layer 160 is formed using a physical vapor deposition process, a plating process, or another suitable process.

As shown in FIG. 1E, the conductive layer 160 outside of the opening 152 and the recess 154 is removed, in accordance with some embodiments. The conductive layer 160 remaining in the opening 152 forms a filler structure 162, in accordance with some embodiments. The filler structure 162 and the dielectric layer 150 are made of different materials. The conductive layer 160 remaining in the recess 154 forms a conductive interconnection structure 164, in accordance with some embodiments. The conductive interconnection structure 164 includes a conductive line, a contact, or another suitable conductive structure.

The removal process includes a chemical mechanical polishing process, in accordance with some embodiments. In some embodiments, a top surface 156 of the dielectric layer 150, a top surface 162a of the filler structure 162, and a top surface 164a of the conductive interconnection structure 164 are aligned with each other.

As shown in FIG. 1F, a dielectric layer 170 is formed over the dielectric layer 150, in accordance with some embodiments. The dielectric layer 170 has an opening 172 and a recess 174, in accordance with some embodiments. The opening 172 exposes the filler structure 162, in accordance with some embodiments. The opening 172 includes a trench, a hole, or an opening with a suitable shape depending on requirements or the layout design of conductive features formed over the substrate 110, in accordance with some embodiments.

In some embodiments, a width W2 of the opening 172 decreases in the direction V toward the substrate 110. The width W2 of the opening 172 continuously decreases in the direction V, in accordance with some embodiments. The recess 174 exposes the conductive interconnection structure 164 thereunder, in accordance with some embodiments.

The recess 174 includes a via hole or an opening with a suitable shape depending on requirements or the layout design of conductive features formed over the substrate 110, in accordance with some embodiments. The dielectric layer 170 includes, but is not limited to, oxide, $SiO_2$, borophosphosilicate glass (BPSG), spin on glass (SOG), undoped silicate glass (USG), fluorinated silicate glass (FSG), high-density plasma (HDP) oxide, or plasma-enhanced TEOS (PETEOS).

The dielectric layer 170 may include multilayers made of multiple dielectric materials, such as a low dielectric constant or an extreme low dielectric constant (ELK) material. The dielectric layer 170 may be formed by chemical vapor deposition (CVD), physical vapor deposition (PVD), atomic layer deposition (ALD), spin-on coating, or another applicable process. The dielectric layer 170 is patterned using a photolithography process and an etching process, in accordance with some embodiments. The dielectric layers 150 and 170 are made of the same material, in accordance with some embodiments.

As shown in FIG. 1G, a conductive layer 180 is formed over the dielectric layer 170 and filled into the opening 172 and the recess 174, in accordance with some embodiments. The conductive layer 180 includes copper (Cu), tungsten (W), aluminum (Al), or another suitable material. The conductive layer 180 is formed using a physical vapor deposition process, a plating process, or another suitable process.

As shown in FIG. 1H, the conductive layer 180 outside of the opening 172 and the recess 174 is removed, in accordance with some embodiments. The conductive layer 180 remaining in the opening 172 forms a filler structure 182, in accordance with some embodiments. The filler structure 182 and the dielectric layer 170 are made of different materials. The conductive layer 180 remaining in the recess 174 forms a conductive interconnection structure 184, in accordance with some embodiments. The conductive interconnection structure 184 includes a conductive via structure, a conductive line, a contact, or another suitable conductive structure.

The removal process includes a chemical mechanical polishing process, in accordance with some embodiments. In some embodiments, a top surface 176 of the dielectric layer 170, a top surface 182a of the filler structure 182, and a top surface 184a of the conductive interconnection structure 184 are aligned with each other.

As shown in FIG. 1I, a dielectric layer 190 is formed over the dielectric layer 170, in accordance with some embodiments. The dielectric layer 190 has an opening 192 and a recess 194, in accordance with some embodiments. The opening 192 exposes the filler structure 182, in accordance with some embodiments. The opening 192 includes a trench, a hole, or an opening with a suitable shape depending on requirements or the layout design of conductive features formed over the substrate 110, in accordance with some embodiments.

In some embodiments, a width W3 of the opening 192 decreases in the direction V toward the substrate 110. The width W3 of the opening 192 continuously decreases in the direction V, in accordance with some embodiments. The minimum width W3 of the opening 192 is less than the maximum width W2 of the opening 172, in accordance with some embodiments. The minimum width W2 of the opening 172 is less than the maximum width W1 of the opening 152, in accordance with some embodiments.

The recess 194 exposes the conductive interconnection structure 184 thereunder, in accordance with some embodiments. The recess 194 includes a trench, a via hole, or an opening with a suitable shape depending on requirements or the layout design of conductive features formed over the substrate 110, in accordance with some embodiments. The dielectric layer 190 includes, but is not limited to, oxide, $SiO_2$, borophosphosilicate glass (BPSG), spin on glass (SOG), undoped silicate glass (USG), fluorinated silicate glass (FSG), high-density plasma (HDP) oxide, or plasma-enhanced TEOS (PETEOS).

The dielectric layer 190 may include multilayers made of multiple dielectric materials, such as a low dielectric constant or an extreme low dielectric constant (ELK) material. The dielectric layer 190 may be formed by chemical vapor deposition (CVD), physical vapor deposition (PVD), atomic layer deposition (ALD), spin-on coating, or another applicable process. The dielectric layer 190 is patterned using a photolithography process and an etching process, in accordance with some embodiments. The dielectric layers 150, 170, and 190 are made of the same material, in accordance with some embodiments.

As shown in FIG. 1J, a conductive layer 210 is formed over the dielectric layer 190 and filled into the opening 192 and the recess 194, in accordance with some embodiments. The conductive layer 210 includes copper (Cu), tungsten (W), aluminum (Al), or another suitable material. The conductive layer 210 is formed using a physical vapor deposition process, a plating process, or another suitable process.

As shown in FIG. 1K, the conductive layer 210 outside of the opening 192 and the recess 194 is removed, in accordance with some embodiments. The conductive layer 210 remaining in the opening 192 forms a filler structure 212, in accordance with some embodiments. The conductive layer 210 remaining in the recess 194 forms a conductive interconnection structure 214, in accordance with some embodiments. The conductive interconnection structure 214 includes a conductive line, a conductive via structure, a contact, or another suitable conductive structure.

The removal process includes a chemical mechanical polishing process, in accordance with some embodiments. In some embodiments, a top surface 196 of the dielectric layer 190, a top surface 212a of the filler structure 212, and a top surface 214a of the conductive interconnection structure 214 are aligned with each other. In some embodiments, the filler structures 212, 182, and 162 are made of the same material. The filler structures 212, 182, and 162 are made of a conductive material, such as a metal material. In some other embodiments, the filler structures 212, 182, and 162 are made of an insulating material.

As shown in FIG. 1L, a mask layer 220 is formed over the conductive interconnection structure 214, in accordance with some embodiments. The mask layer 220 further covers a portion of the dielectric layer 190, in accordance with some embodiments. The mask layer 220 exposes the filler structure 212, in accordance with some embodiments. The mask layer 220 exposes the entire top surface 212a of the filler structure 212, in accordance with some embodiments. The mask layer 220 includes a photoresist material or another suitable material.

As shown in FIG. 1M, the filler structures 212, 182, and 162 are removed, in accordance with some embodiments. After the removal process, the openings 152, 172, and 192 expose the conductive structure 140, in accordance with some embodiments. The openings 152, 172, and 192 further expose the barrier layer 130 and a portion of the liner layer 120, in accordance with some embodiments.

Since the filler structures 212, 182, and 162 are made of the same material, the filler structures 212, 182, and 162 are removed in one etching process simultaneously, in accordance with some embodiments. Therefore, the removal process of the filler structures 212, 182, and 162 made of the same material is simplified. The etching solution used in the etching process includes an acid solution, in accordance with some embodiments.

As shown in FIG. 1N, the mask layer 220 is removed, in accordance with some embodiments. As shown in FIG. 1N, the opening 192 has an inner wall 192a, the opening 172 has an inner wall 172a, and the opening 152 has an inner wall 152a, in accordance with some embodiments. A portion of a bottom surface 178 of the dielectric layer 170 is over the opening 152, in accordance with some embodiments. A portion of a bottom surface 198 of the dielectric layer 190 is over the opening 172, in accordance with some embodiments.

As shown in FIG. 1O, a liner layer 230 is formed over the dielectric layer 190 and formed in the openings 152, 172, and 192, in accordance with some embodiments. The liner layer 230 includes oxide, such as silicon oxide, in accordance with some embodiments. The liner layer 230 is formed using a chemical vapor deposition process, a physical vapor deposition process, or another suitable process.

The liner layer 230 covers the inner walls 192a, 172a, and 152a, the bottom surfaces 198 and 178 over the openings 172 and 152, and the top surfaces 142, 132, and 122 of the conductive structure 140, the barrier layer 130, and the liner layer 120, in accordance with some embodiments. The liner layer 230 conformally covers the inner walls 192a, 172a, and 152a and the bottom surfaces 198 and 178, in accordance with some embodiments. The liner layer 230 covering the inner walls 192a, 172a, and 152a and the bottom surfaces 198 and 178 is in a sawtooth shape, in accordance with some embodiments.

As shown in FIG. 1P, a portion of the liner layer 230 covering the conductive structure 140 is removed, in accordance with some embodiments. In some embodiments, another portion of the liner layer 230 covering the barrier layer 130 is removed as well. After the removal process, the liner layer 230 has an opening 232 exposing the conductive structure 140 and the barrier layer 130, in accordance with some embodiments. The removal process includes a photolithography process and an etching process, in accordance with some embodiments. The etching process includes a dry etching process, a wet etching process, or another suitable etching process. In some other embodiments, the liner layer 230 is not formed.

As shown in FIG. 1Q, an electrode layer 240 is formed over the liner layer 230 and the conductive structure 140, in accordance with some embodiments. The electrode layer 240 is electrically connected to the conductive structure 140, in accordance with some embodiments. The electrode layer 240 conformally covers the inner walls 192a, 172a, and 152a of the openings 192, 172, and 152, the bottom surfaces 198 and 178 of the dielectric layers 190 and 170, and the top surfaces 142, 132, and 122 of the conductive structure 140, the barrier layer 130, and the liner layer 120, in accordance with some embodiments. Therefore, the electrode layer 240, which is over the inner walls 192a, 172a, and 152a and the bottom surfaces 198 and 178, is in a sawtooth shape, in accordance with some embodiments.

The electrode layer 240 includes a conductive material, in accordance with some embodiments. The conductive material includes titanium nitride (TiN), copper, tungsten, aluminum, or another suitable conductive material. The electrode layer 240 is formed using a physical vapor deposition process, a chemical vapor deposition process, a plating process, or another suitable process.

As shown in FIG. 1Q, a dielectric layer 250 is formed over the electrode layer 240, in accordance with some embodiments. The dielectric layer 250 conformally covers the electrode layer 240, in accordance with some embodiments. The dielectric layer 250, which is over the inner walls 192a, 172a, and 152a and the bottom surfaces 198 and 178, is in a sawtooth shape, in accordance with some embodiments.

The dielectric layer 250 includes oxide, in accordance with some embodiments. The dielectric layer 250 includes zirconium oxide ($ZrO_2$) or another suitable dielectric material. The dielectric layer 250 is formed using a chemical vapor deposition process, an atomic layer deposition (ALD) process, a physical vapor deposition process, or another suitable process.

As shown in FIG. 1Q, an electrode layer 260 is formed over the dielectric layer 250, in accordance with some embodiments. The electrode layer 260 conformally covers the dielectric layer 250 in the openings 152, 172, and 192, in accordance with some embodiments. Therefore, the electrode layer 260, which is over the inner walls 192a, 172a, and 152a and the bottom surfaces 198 and 178, is in a sawtooth shape, in accordance with some embodiments.

The electrode layer 260 includes a conductive material, in accordance with some embodiments. The conductive material includes titanium nitride (TiN), copper, tungsten, aluminum, or another suitable conductive material. The electrode layer 260 is formed using a physical vapor deposition process, a chemical vapor deposition process, a plating process, or another suitable process.

As shown in FIG. 1R, a conductive layer 270 is formed over the electrode layer 260 and filled into the openings 152, 172, and 192, in accordance with some embodiments. The conductive layer 270 is electrically connected to the electrode layer 260, in accordance with some embodiments. The conductive layer 270 includes metal, such as copper, tungsten, or aluminum, in accordance with some embodiments. In some other embodiments, the layer 270 is an insulating layer. The conductive layer 270 is formed using a physical vapor deposition process, a chemical vapor deposition process, a plating process, or another suitable process.

As shown in FIG. 1S, the liner layer 230, the electrode layer 240, the dielectric layer 250, the electrode layer 260, and the conductive layer 270 outside of the openings 152, 172, and 192 are removed, in accordance with some embodiments. The removal process includes a chemical mechanical polishing process, in accordance with some embodiments.

Therefore, the top surfaces 214a, 196, 232, 242, 252, 262, and 272 of the conductive interconnection structure 214, the dielectric layer 190, the liner layer 230, the electrode layer 240, the dielectric layer 250, the electrode layer 260, and the conductive layer 270 are aligned with each other, in accordance with some embodiments. The electrode layer 240, the dielectric layer 250, and the electrode layer 260 remaining in the openings 152, 172, and 192 form a capacitor 310, in accordance with some embodiments.

Since the process for forming the capacitor 310 includes deposition processes and a chemical mechanical polishing process, the process is simplified, which reduces the cost of the process. In some other embodiments, the removal process includes photolithography processes and etching processes.

The capacitor 310 covers the inner walls 152a, 172a, and 192a of the openings 152, 172, and 192, the bottom surfaces 178 and 198 of the dielectric layers 170 and 190, and the top surface 142 of the conductive structure 140, in accordance with some embodiments. The capacitor 310 conformally covers the inner walls 152a, 172a, and 192a, the bottom surfaces 178 and 198, and the top surface 142, in accordance with some embodiments.

In some embodiments, a portion of the capacitor 310 covering the inner walls 152a, 172a, and 192a, and the bottom surfaces 178 and 198 is in a sawtooth shape. The capacitor 310 in the sawtooth shape has a capacitor area greater than that of a capacitor in a planar shape in the same space, in accordance with some embodiments. Therefore, the capacitor 310 has a capacitance greater than that of the capacitor in a planar shape in the same space, in accordance with some embodiments.

The capacitor 310 is electrically connected to the conductive structure 140, in accordance with some embodiments. The dielectric layer 250 is between the electrode layers 240 and 260, in accordance with some embodiments. The dielectric layer 250 separates the electrode layer 240 from the electrode layer 260, in accordance with some embodiments. The electrode layer 240 surrounds the dielectric layer 250, the electrode layer 260, and the conductive layer 270, in accordance with some embodiments. The liner layer 230 surrounds the capacitor 310 and the conductive layer 270, in accordance with some embodiments.

As shown in FIG. 1T, bottom portions of the substrate 110, the liner layer 120, the barrier layer 130, and the conductive structure 140 are removed, in accordance with some embodiments. The removal process includes performing a chemical mechanical polishing process on a bottom surface 116 of the substrate 110 until the conductive structure 140 is exposed, in accordance with some embodiments. In this step, a semiconductor device structure 100 is substantially formed.

The capacitor 310 has a recess 312 in the openings 152, 172, and 192, in accordance with some embodiments. The conductive layer 270 is filled in the recess 312 and is electrically connected to the electrode layer 260 of the capacitor 310, in accordance with some embodiments. The recess 312 has an upper portion 312a, a medium portion 312b, a lower portion 312c, and neck portions 312d and 312e, in accordance with some embodiments. The neck portion 312d is between the upper portion 312a and the medium portion 312b, in accordance with some embodiments. The neck portion 312e is between the medium portion 312b and the lower portion 312c, in accordance with some embodiments.

The upper portion 312a, the medium portion 312b, and the lower portion 312c are in the dielectric layers 190, 170, and 150, respectively, in accordance with some embodiments. The neck portion 312d has a minimum width W4 less than a width W5 of the upper portion 312a, a width W6 of the medium portion 312b, and/or a width W7 of the lower portion 312c, in accordance with some embodiments. The neck portion 312e has a minimum width W8 less than the width W6 of the medium portion 312b, the width W7 of the lower portion 312c, and/or the width W5 of the upper portion 312a, in accordance with some embodiments.

In some embodiments, the width W5 of the upper portion 312a decreases in a direction V1 toward the neck portion 312d. The width W5 of the upper portion 312a continuously decreases in the direction V1, in accordance with some embodiments. In some embodiments, the width W6 of the medium portion 312b decreases in a direction V2 toward the neck portion 312e.

The width W6 of the medium portion 312b continuously decreases in the direction V2, in accordance with some embodiments. In some embodiments, the width W7 of the lower portion 312c decreases in the direction V toward the substrate 110. The width W7 of the lower portion 312c continuously decreases in the direction V, in accordance with some embodiments. The directions V, V1, and V2 are the same direction, in accordance with some embodiments.

The capacitor 310 may be optionally formed in two, three, or more dielectric layers depending on requirements or the layout design of conductive features formed over the substrate 110, in accordance with some embodiments. The capacitance of the capacitor 310 is adjustable by adjusting the number of dielectric layers penetrated by the capacitor 310, in accordance with some embodiments. Therefore, the design flexibility of the capacitor 310 is increased. The capacitor 310 is able to be formed in a logic chip, an embedded dynamic random access memory (eDRAM) chip, a DRAM chip, or the like.

Figure 2:
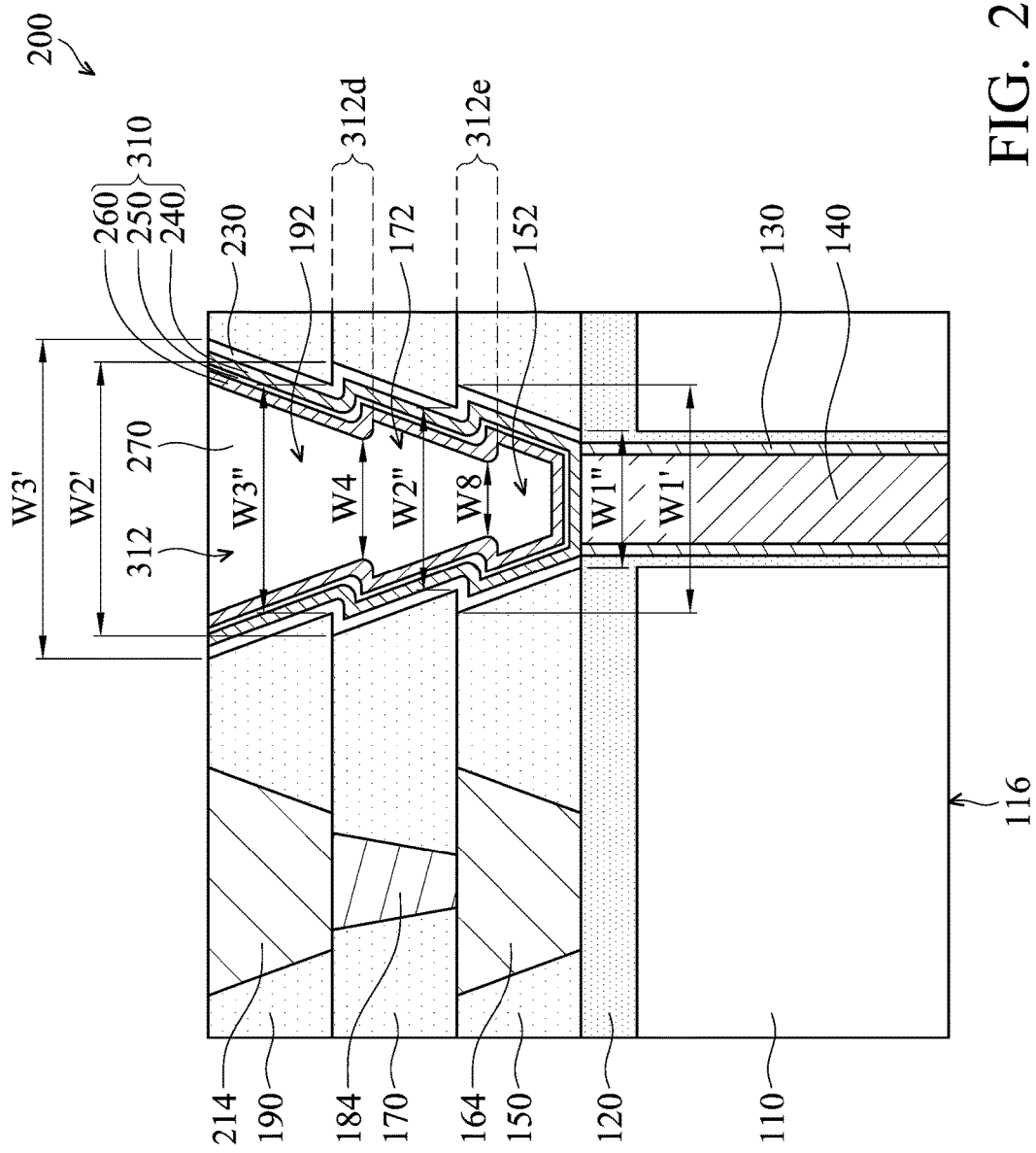
FIG. 2 is a cross-sectional view of a semiconductor device structure, in accordance with some embodiments.

FIG. 2 is a cross-sectional view of a semiconductor device structure, in accordance with some embodiments. As shown in FIG. 2, a semiconductor device structure 200 is similar to the semiconductor device structure 100 of FIG. 1T, except that in the semiconductor device structure 200, a maximum width W2' of the opening 172 is greater than a maximum width W1' of the opening 152, in accordance with some embodiments. Furthermore, a maximum width W3' of the opening 192 is greater than a maximum width W2' of the opening 172, in accordance with some embodiments.

A minimum width W2" of the opening 172 is greater than a minimum width W1" of the opening 152, in accordance with some embodiments. Furthermore, a minimum width W3" of the opening 192 is greater than a minimum width W2" of the opening 172, in accordance with some embodiments. Therefore, the liner layer 230, the electrode layer 240, the dielectric layer 250, the electrode layer 260, and the conductive layer 270 may be deposited in the openings 192, 172, and 152 uniformly and easily. In the recess 312, the minimum width W4 of the neck portion 312d is greater than the minimum width W8 of the neck portion 312e, in accordance with some embodiments.

Figure 3:
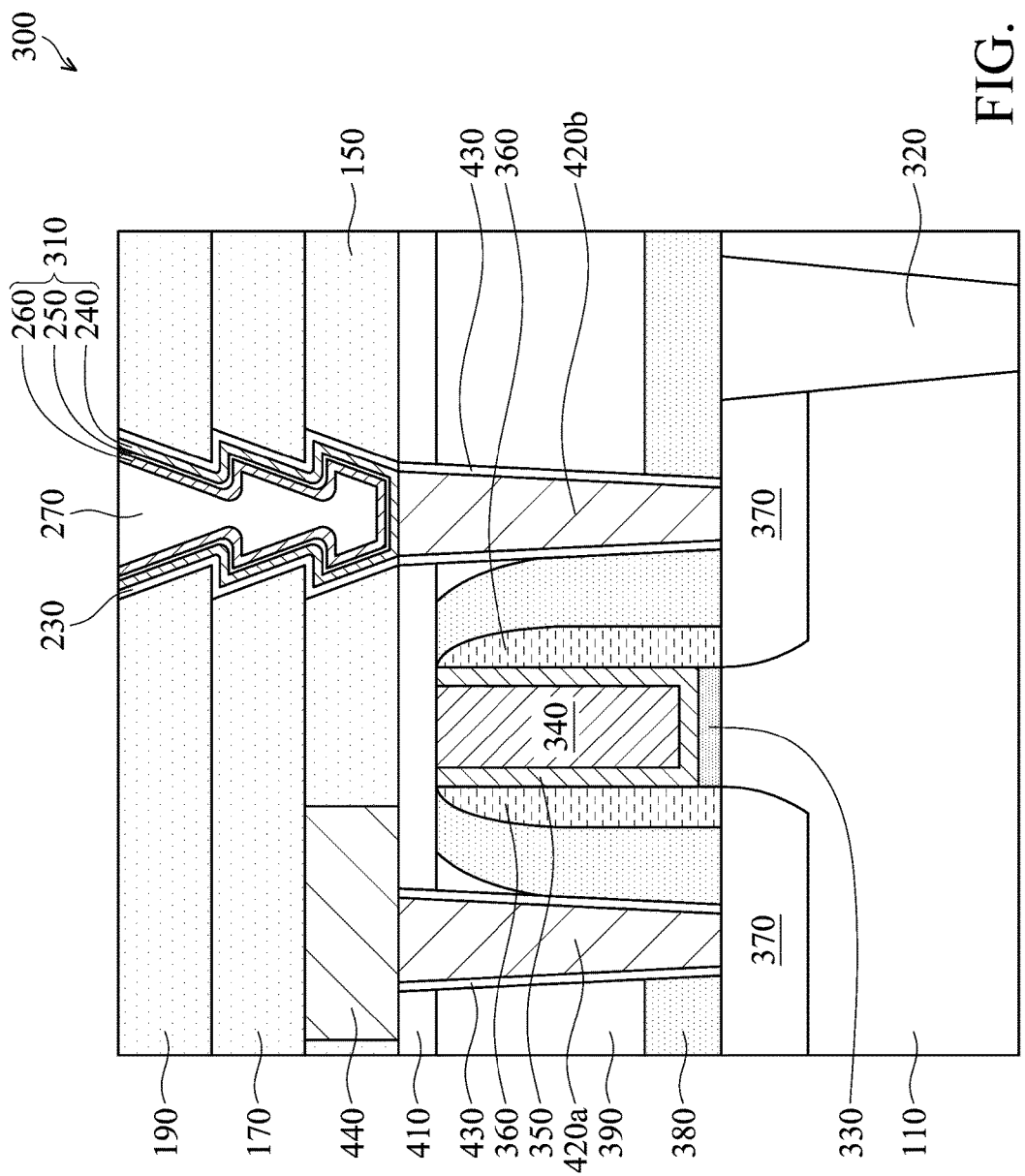
FIG. 3 is a cross-sectional view of a semiconductor device structure, in accordance with some embodiments.

FIG. 3 is a cross-sectional view of a semiconductor device structure, in accordance with some embodiments. As shown in FIG. 3, a semiconductor device structure 300 is similar to the semiconductor device structure 100 of FIG. 1T, except that the capacitor 310 of the semiconductor device structure 300 is formed in an embedded dynamic random access memory (eDRAM) chip.

As shown in FIG. 3, an isolation structure 320 is formed in the substrate 110 to define various active regions in the substrate 110, and to electrically isolate neighboring devices (e.g. transistors) from one another. The isolation structure 320 is made of a dielectric material, in accordance with some embodiments. The dielectric material includes silicon oxide, silicon nitride, silicon oxynitride, fluoride-doped silicate glass (FSG), a low-K dielectric material, other suitable materials, or combinations thereof, in accordance with some embodiments. The isolation structure 320 is formed by using an isolation technology, such as local oxidation of semiconductor (LOCOS), shallow trench isolation (STI), or the like.

In some embodiments, the formation of the isolation structure 320 includes patterning the substrate 110 by a photolithography process, etching a trench in the substrate 110 (for example, by using a dry etching, wet etching, plasma etching process, or combinations thereof), and filling the trench (for example, by using a chemical vapor deposition process) with the dielectric material. In some embodiments, the filled trench may have a multi-layer structure, such as a thermal oxide liner layer filled with silicon nitride or silicon oxide.

As shown in FIG. 3, a gate dielectric layer 330 and a gate electrode 340 are formed over the substrate 110. The gate dielectric layer 330 is made of a dielectric material, such as a high dielectric constant (high-k) material, in accordance with some embodiments. The high-k material is made of hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), other suitable high-k dielectric materials, or combinations thereof. The gate dielectric layer 330 is formed using an atomic layer deposition (ALD) process, a chemical vapor deposition (CVD) process, or other suitable processes.

The gate electrode 340 (also called a metal gate electrode) is formed using a gate-last approach or a replacement-gate (RPG) approach, in accordance with some embodiments. The gate electrode 340 is made of a suitable metal material, such as aluminum, tungsten, gold, platinum, cobalt, other suitable metal, alloy thereof, or combinations thereof, in accordance with some embodiments. The gate electrode 340 is deposited using a PVD process, CVD process, plating process, the like, or combinations thereof, in accordance with some embodiments.

As shown in FIG. 3, the gate electrode 340 is formed between spacers 360 over the substrate 110, in accordance with some embodiments. The spacers 360 are made of a dielectric material, in accordance with some embodiments. The dielectric material includes silicon nitride layer, silicon oxynitride layer, or combinations thereof, in accordance with some embodiments.

In some embodiments, a work function metal layer 350 is formed between the spacers 360 and the gate electrode 340 and between the gate electrode 340 and the gate dielectric layer 330. The work function metal layer 350 provides desired work function for transistors to enhance device performance including improved threshold voltage. In the embodiments of forming an NMOS transistor, the work function metal layer 350 can be an n-type metal. The n-type metal is made of tantalum, tantalum nitride, or combinations thereof, in accordance with some embodiments.

On the other hand, in the embodiments of forming a PMOS transistor, the work function metal layer 350 can be a p-type metal. The p-type metal is made of titanium, titanium nitride, other suitable materials, or combinations thereof, in accordance with some embodiments.

The work function metal layer 350 may also be made of hafnium, zirconium, titanium, tantalum, aluminum, metal carbides (e.g., hafnium carbide, or zirconium carbide), aluminides, ruthenium or combinations thereof. The work function metal layer 350 is deposited using a PVD process, CVD process, ALD process, plating process, another suitable method, or combinations thereof.

As shown in FIG. 3, doped regions 370 is formed in the substrate 110 using a suitable process, such as an ion implantation process. The doped regions 370 is a heavily doped source region and a heavily doped drain region, in accordance with some embodiments.

As shown in FIG. 3, a contact etch stop layer 380 is formed over the substrate 110 and sidewalls of the spacers 360, in accordance with some embodiments. The contact etch stop layer 380 is made of a dielectric material, such as silicon nitride, in accordance with some embodiments. The contact etch stop layer 380 is conformally formed over the sidewalls of the spacers 360 and the substrate 110, in accordance with some embodiments. However, in some embodiments, the contact etch stop layer 380 is not formed.

As shown in FIG. 3, an insulating layer 390 is then deposited over the substrate 110, in accordance with some embodiments. The gate electrode 340, the work function metal layer 350, and the gate dielectric layer 330 together form a gate stack (i.e., a metal gate stack), which is surrounded by the insulating layer 390.

The insulating layer 390 is made of any suitable insulating material, such as silicon oxide, silicon oxynitride, borosilicate glass (BSG), phosphoric silicate glass (PSG), borophosphosilicate glass (BPSG), fluorinated silicate glass (FSG), low-k material, porous dielectric material, or combinations thereof. The insulating layer 390 is deposited by any suitable process, such as a CVD process, HDPCVD process, spin-on process, sputtering process, or combinations thereof.

As shown in FIG. 3, an etch stop layer 410 (also called an insulating layer or a dielectric layer) is deposited over the insulating layer 390, the contact etch stop layer 380, the work function metal layer 350, and the gate electrode 340, in accordance with some embodiments. The etch stop layer 410 is made of silicon nitride or other suitable materials.

As shown in FIG. 3, contact plugs 420*a* and 420*b* are formed over the doped regions 370, respectively, in accordance with some embodiments. Each of the contact plugs 420*a* and 420*b* is electrically connected to the doped region 370 thereunder, in accordance with some embodiments. The contact plugs 420*a* and 420*b* penetrate the contact etch stop layer 380, the insulating layer 390, and the etch stop layer 410, in accordance with some embodiments. The contact plugs 420*a* and 420*b* includes tungsten or other suitable conductive materials.

As shown in FIG. 3, a dielectric spacer liner layer 430 is formed between the contact plug 420*a* and the contact etch stop layer 380, between the contact plug 420*a* and the insulating layer 390, and between the contact plug 420*a* and the etch stop layer 410, in accordance with some embodiments. The dielectric spacer liner layer 430 is formed between the contact plug 420*b* and the contact etch stop layer 380, between the contact plug 420*b* and the insulating layer 390, and between the contact plug 420*b* and the etch stop layer 410, in accordance with some embodiments. The dielectric spacer liner layer 430 is made of SiOC or other suitable materials.

As shown in FIG. 3, a conductive line 440 is formed over the contact plug 420*a* and the etch stop layer 410 to electrically connected to the contact plug 420*a*, in accordance with some embodiments. The conductive line 440 includes copper, tungsten, aluminum, or another suitable conductive material, in accordance with some embodiments. In some embodiments, the conductive line 440 is a bit line, and the contact plug 420*a* is a bit line contact plug.

As shown in FIG. 3, the dielectric layers 150, 170, and 190 are sequentially formed over the etch stop layer 410, in accordance with some embodiments. The conductive line 440 is embedded in the dielectric layers 150, in accordance with some embodiments. Thereafter, the liner layer 230, the capacitor 310, and the conductive layer 270 are formed in the dielectric layers 150, 170, and 190 and penetrate through the dielectric layers 150, 170, and 190, in accordance with some embodiments.

The capacitor 310 is electrically connected to the contact plug 420*b* and the conductive layer 270, in accordance with some embodiments. The capacitor 310 is in direct contact with the contact plug 420*b* and the conductive layer 270, in accordance with some embodiments. The contact plug 420*b* is also referred to as a storage node contact plug, in accordance with some embodiments.

The materials, the manufacturing methods, the structures of the dielectric layers 150, 170, and 190, the liner layer 230, the capacitor 310, and the conductive layer 270 are similar to that of the semiconductor device structure 100 of FIG. 1T. Therefore, for the sake of simplicity, the detail description of the dielectric layers 150, 170, and 190, the liner layer 230, the capacitor 310, and the conductive layer 270 is not repeated.

Figure 4:
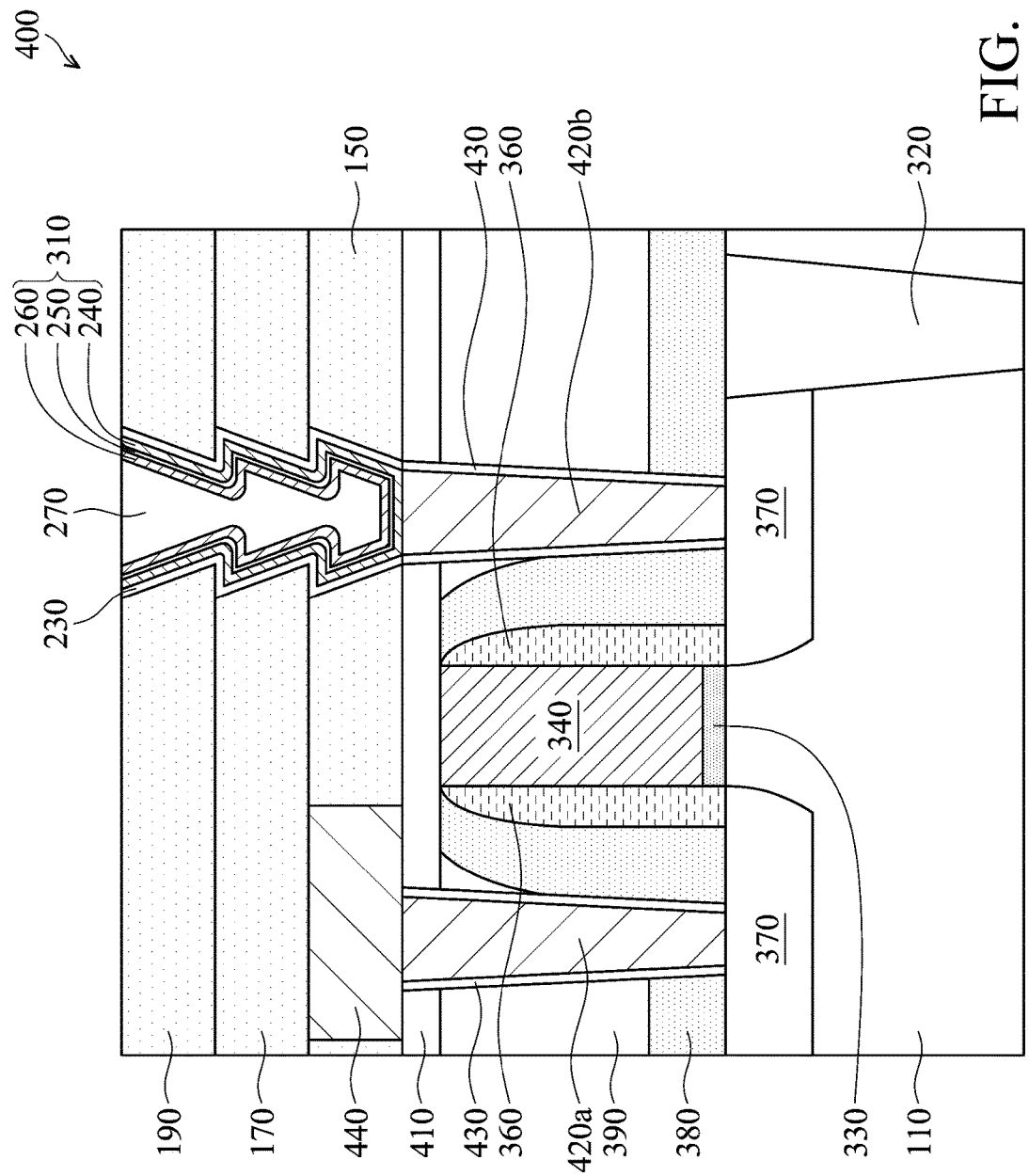
FIG. 4 is a cross-sectional view of a semiconductor device structure, in accordance with some embodiments.

FIG. 4 is a cross-sectional view of a semiconductor device structure, in accordance with some embodiments. As shown in FIG. 4, a semiconductor device structure 400 is similar to the semiconductor device structure 300 of FIG. 3, except that the gate electrode 340 of the semiconductor device structure 400 is a poly gate, and the semiconductor device structure 400 does not have the work function metal layer 350, in accordance with some embodiments.

Figure 5:
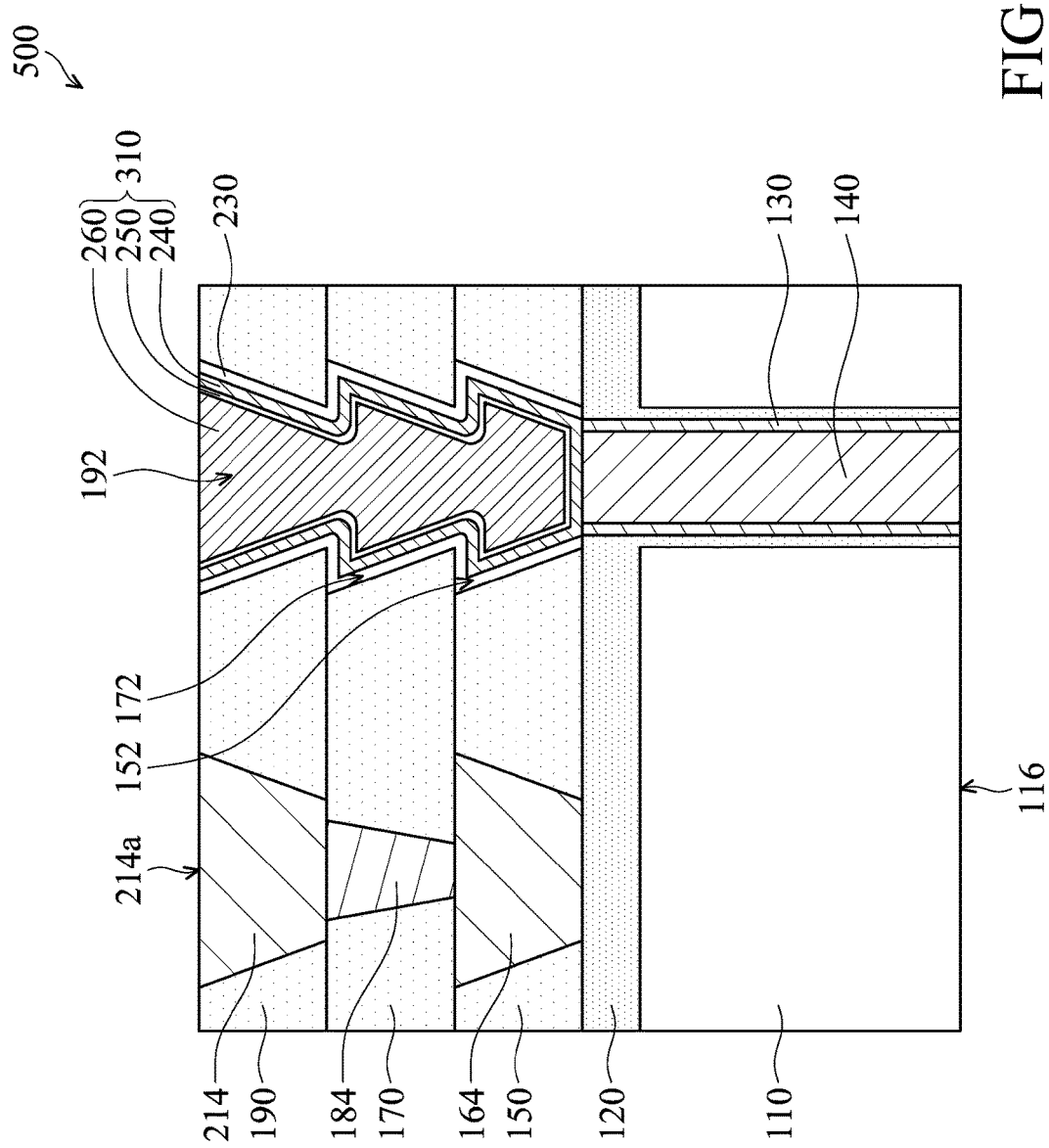
FIG. 5 is a cross-sectional view of a semiconductor device structure, in accordance with some embodiments.

FIG. 5 is a cross-sectional view of a semiconductor device structure, in accordance with some embodiments. As shown in FIG. 5, a semiconductor device structure 500 is similar to the semiconductor device structure 100 of FIG. 1T, except that the capacitor 310 and the liner layer 230 of the semiconductor device structure 500 fills the openings 152, 172, and 192, in accordance with some embodiments. In some embodiments, most of the openings 152, 172, and 192 is filled with the electrode layer 260. In some embodiments, the liner layer 230 is not formed, and the openings 152, 172, and 192 are filled with the capacitor 310.

In accordance with some embodiments, semiconductor device structures and methods for forming the same are provided. The methods (for forming the semiconductor device structure) form a capacitor passing through dielectric layers. The capacitance of the capacitor is adjustable by adjusting the number of dielectric layers penetrated through by the capacitor. Therefore, the design flexibility of the capacitor is increased. Furthermore, the process for forming the capacitor is simplified, which reduces the cost of the process.

In accordance with some embodiments, a semiconductor device structure is provided. The semiconductor device structure includes a substrate. The semiconductor device structure includes a conductive structure in or over the substrate. The semiconductor device structure includes a first dielectric layer over the substrate. The first dielectric layer has a first opening exposing the conductive structure. The semiconductor device structure includes a second dielectric layer over the first dielectric layer. The second dielectric layer has a second opening connected to the first opening and exposing the conductive structure. The semiconductor device structure includes a capacitor covering a first inner wall of the first opening, a second inner wall of the second opening, and a top surface of the conductive structure. The capacitor is electrically connected to the conductive structure.

In accordance with some embodiments, a semiconductor device structure is provided. The semiconductor device structure includes a substrate. The semiconductor device structure includes a conductive structure in or over the substrate. The semiconductor device structure includes a first dielectric layer over the substrate. The first dielectric layer has a first opening exposing the conductive structure. The semiconductor device structure includes a second dielectric layer over the first dielectric layer. The second dielectric layer has a second opening connected to the first opening and exposing the conductive structure. A first maximum width of the second opening is greater than a second maximum width of the first opening. The semiconductor device structure includes a capacitor covering a first inner wall of the first opening, a second inner wall of the second opening, and a top surface of the conductive structure. The capacitor is electrically connected to the conductive structure.

In accordance with some embodiments, a method for forming a semiconductor device structure is provided. The method includes forming a conductive structure in or over the substrate. The method includes forming a first dielectric layer over the substrate. The first dielectric layer has a first opening exposing the conductive structure. The method includes filling a first filler structure into the first opening. The first filler structure and the first dielectric layer are made of different materials. The method includes forming a second dielectric layer over the first dielectric layer. The second dielectric layer has a second opening exposing the first filler structure. The method includes removing the first filler structure. The method includes forming a capacitor over a first inner wall of the first opening, a second inner wall of the second opening, and a top surface of the conductive structure. The capacitor is electrically connected to the conductive structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a substrate;
   a conductive structure in or over the substrate;
   a first dielectric layer over the substrate, wherein the first dielectric layer has a first opening exposing the conductive structure;
   a second dielectric layer over the first dielectric layer, wherein the second dielectric layer has a second opening connected to the first opening and exposing the conductive structure, the second dielectric layer has a bottom surface, a first portion of the bottom surface is located directly above the first opening, and the first dielectric layer and the second dielectric layer are made of a same material; and
   a capacitor covering a first inner wall of the first opening, a second inner wall of the second opening, and a top surface of the conductive structure, wherein the capacitor is electrically connected to the conductive structure, the first inner wall of the first opening starts at a top of the first dielectric layer, ends at a bottom of the first dielectric layer, and is a first slanted sidewall, the second inner wall of the second opening starts at a top of the second dielectric layer, ends at a bottom of the second dielectric layer, and is a second slanted sidewall, the first portion of the bottom surface is directly connected to the first slanted sidewall and the second slanted sidewall, and the first portion of the bottom surface, the first slanted sidewall, and the second slanted sidewall together form a sawtooth surface.

2. The semiconductor device structure as claimed in claim 1, wherein a first portion of the capacitor covering the first inner wall, the second inner wall, and the first portion of the bottom surface is in a sawtooth shape.

3. The semiconductor device structure as claimed in claim 1, wherein the capacitor has a recess in the first opening and the second opening.

4. The semiconductor device structure as claimed in claim 3, further comprising:
   a conductive layer filled in the recess and electrically connected to the capacitor.

5. The semiconductor device structure as claimed in claim 3, wherein the recess has an upper portion, a lower portion, and a neck portion between the upper portion and the lower portion, and the neck portion has a first width less than a second width of the upper portion and a third width of the lower portion.

6. The semiconductor device structure as claimed in claim 1, wherein the capacitor has a first electrode layer, a third dielectric layer, and a second electrode layer, the third dielectric layer is between the first electrode layer and the second electrode layer, and the first electrode layer surrounds the third dielectric layer and the second electrode layer.

7. The semiconductor device structure as claimed in claim 6, wherein a first portion of the first electrode layer covering the first inner wall, the second inner wall, and the first portion of the bottom surface is in a sawtooth shape.

8. A semiconductor device structure, comprising:
   a substrate;
   a conductive structure in or over the substrate;
   a first dielectric layer over the substrate, wherein the first dielectric layer has a first opening exposing the conductive structure, and the first opening continuously shrinks in a direction toward the substrate;
   a second dielectric layer over the first dielectric layer, wherein the second dielectric layer has a second opening connected to the first opening and exposing the conductive structure, and a first maximum width of the second opening is greater than a second maximum width of the first opening, the second dielectric layer has a bottom surface, a portion of the bottom surface is located directly above the first opening, and the first dielectric layer and the second dielectric layer are made of a same material; and
   a capacitor covering a first inner wall of the first opening, a second inner wall of the second opening, and a top surface of the conductive structure, wherein the capacitor is electrically connected to the conductive structure, the first inner wall of the first opening starts at a top of the first dielectric layer, ends at a bottom of the first dielectric layer, and is a first slanted sidewall, the second inner wall of the second opening starts at a top of the second dielectric layer, ends at a bottom of the second dielectric layer, and is a second slanted sidewall, the portion of the bottom surface is directly connected to the first slanted sidewall and the second slanted sidewall, and the portion of the bottom surface, the first slanted sidewall, and the second slanted sidewall together form a sawtooth surface.

9. The semiconductor device structure as claimed in claim 8, wherein a first minimum width of the second opening is greater than a second minimum width of the first opening.

10. The semiconductor device structure as claimed in claim 8, wherein the capacitor has a recess in the first opening and the second opening.

11. The semiconductor device structure as claimed in claim 10, further comprising:
a conductive layer filled in the recess and electrically connected to the capacitor.

12. The semiconductor device structure as claimed in claim 11, wherein a first top surface of the conductive layer is aligned with a second top surface of the capacitor.

13. A semiconductor device structure, comprising:
a substrate;
a conductive structure in or over the substrate;
a first dielectric layer over the substrate, wherein the first dielectric layer has a first opening exposing the conductive structure;
a second dielectric layer over the first dielectric layer, wherein the second dielectric layer has a second opening connected to the first opening and exposing the conductive structure, the second dielectric layer has a bottom surface, a portion of the bottom surface is located directly above the first opening, and the first dielectric layer and the second dielectric layer are made of a same material;
a capacitor covering a first inner wall of the first opening, a second inner wall of the second opening, a bottom surface of the second dielectric layer, and a top surface of the conductive structure, wherein the capacitor is electrically connected to the conductive structure, the capacitor has a recess in the first opening and the second opening, the first inner wall of the first opening starts at a top of the first dielectric layer, ends at a bottom of the first dielectric layer, and is a first slanted sidewall, the second inner wall of the second opening starts at a top of the second dielectric layer, ends at a bottom of the second dielectric layer, and is a second slanted sidewall, the portion of the bottom surface is directly connected to the first slanted sidewall and the second slanted sidewall, and the portion of the bottom surface, the first slanted sidewall, and the second slanted sidewall together form a sawtooth surface; and
an insulating layer filled in the recess.

14. The semiconductor device structure as claimed in claim 13, wherein a first top surface of the insulating layer is aligned with a second top surface of the capacitor.

15. The semiconductor device structure as claimed in claim 13, wherein a first top surface of the insulating layer, a second top surface of the capacitor, and a third top surface of the second dielectric layer are aligned with each other.

16. The semiconductor device structure as claimed in claim 13, wherein the capacitor is in direct contact with the conductive structure and the insulating layer.

17. The semiconductor device structure as claimed in claim 13, wherein the insulating layer covers an entirety of a bottom of the recess.

* * * * *